US009917093B2

(12) United States Patent
Chu et al.

(10) Patent No.: US 9,917,093 B2
(45) Date of Patent: Mar. 13, 2018

(54) INTER-PLANE OFFSET IN BACKSIDE CONTACT VIA STRUCTURES FOR A THREE-DIMENSIONAL MEMORY DEVICE

(71) Applicant: SANDISK TECHNOLOGIES LLC, Plano, TX (US)

(72) Inventors: Cheng-Chung Chu, Milpitas, CA (US); Jayavel Pachamuthu, San Jose, CA (US); Tuan Pham, San Jose, CA (US); Fumitoshi Ito, Yokkaichi (JP); Masaaki Higashitani, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 37 days.

(21) Appl. No.: 15/195,446

(22) Filed: Jun. 28, 2016

(65) Prior Publication Data
US 2017/0373078 A1 Dec. 28, 2017

(51) Int. Cl.
*H01L 29/788* (2006.01)
*H01L 27/11556* (2017.01)
(Continued)

(52) U.S. Cl.
CPC ........ *H01L 27/11556* (2013.01); *H01L 21/22* (2013.01); *H01L 21/76802* (2013.01);
(Continued)

(58) Field of Classification Search
None
See application file for complete search history.

(56) References Cited

U.S. PATENT DOCUMENTS 5,915,167 A 6/1999 Leedy
2009/0267128 A1 10/2009 Mejima
(Continued)

FOREIGN PATENT DOCUMENTS

WO WO2016043968 A1 3/2016

OTHER PUBLICATIONS

International Search Report and Written Opinion from the International Searching Authority for International Patent Application No. PCT/US2017/019503, dated Jul. 11, 2017, 27 pages.
(Continued)

*Primary Examiner* — Cory Eskridge
(74) *Attorney, Agent, or Firm* — The Marbury Law Group PLLC

(57) ABSTRACT

A three-dimensional memory device includes a plurality of planes, each having a respective alternating stack, strings of memory stack structures which extends through the respective alternating stack, and backside contact via structures vertically extending through the respective alternating stack, extending generally along the first horizontal direction, and laterally separating neighboring pairs of strings of memory stack structures along a second horizontal direction. A first plane includes a first plurality of strings that are laterally spaced apart along the second horizontal direction by a first plurality of backside contact via structures. A second plane laterally shifted from the first plane along the first horizontal direction and including a second plurality of strings that are laterally spaced apart along the second horizontal direction by a second plurality of backside contact via structures which are laterally offset with respect the first plurality of backside contact via structures along the second horizontal direction.

17 Claims, 32 Drawing Sheets

(51) Int. Cl.
| | |
|---|---|
| H01L 23/522 | (2006.01) |
| H01L 21/22 | (2006.01) |
| H01L 21/768 | (2006.01) |
| H01L 27/11519 | (2017.01) |
| H01L 27/11565 | (2017.01) |
| H01L 27/1157 | (2017.01) |
| H01L 27/11573 | (2017.01) |
| H01L 27/11582 | (2017.01) |
| H01L 29/417 | (2006.01) |

(52) U.S. Cl.
CPC .... *H01L 21/76877* (2013.01); *H01L 23/5226* (2013.01); *H01L 27/1157* (2013.01); *H01L 27/11519* (2013.01); *H01L 27/11565* (2013.01); *H01L 27/11573* (2013.01); *H01L 27/11582* (2013.01); *H01L 29/41741* (2013.01)

(56) References Cited

U.S. PATENT DOCUMENTS

| | | |
|---|---|---|
| 2012/0001249 A1 | 1/2012 | Alsmeier et al. |
| 2012/0171861 A1 | 7/2012 | Park et al. |
| 2013/0248974 A1 | 9/2013 | Lu et al. |
| 2014/0175534 A1* | 6/2014 | Kofuji ............... H01L 27/11582 257/324 |
| 2016/0086969 A1* | 3/2016 | Zhang ................... H01L 23/528 257/314 |

OTHER PUBLICATIONS

Invitation to Pay Additional Fees and Communication Relating to the Results of the Partial International Search from the International Searching Authority for International Patent Application No. PCT/US2017/019503, dated May 17, 2017, 22 pages.

Endoh et al., "Novel Ultra High Density Memory with a Stacked-Surrounding Gate Transistor (S-SGT) Structured Cell," IEDM Proc. (2001) 33-36.

Invitation to Pay Additional Fees for PCT/US2015/047932, dated Dec. 23, 2015, 9 pages.

International Search Report and Written Opinion for PCT/US2015/047932, dated Mar. 2, 2016, 22 pages.

U.S. Appl. No. 14/491,026, filed Sep. 19, 2014, SanDisk Technologies LLC.

U.S. Appl. No. 14/462,209, filed Aug. 18, 2014, SanDisk Technologies LLC.

U.S. Appl. No. 15/195,377, filed Jun. 28, 2016, SanDisk Technologies LLC.

* cited by examiner

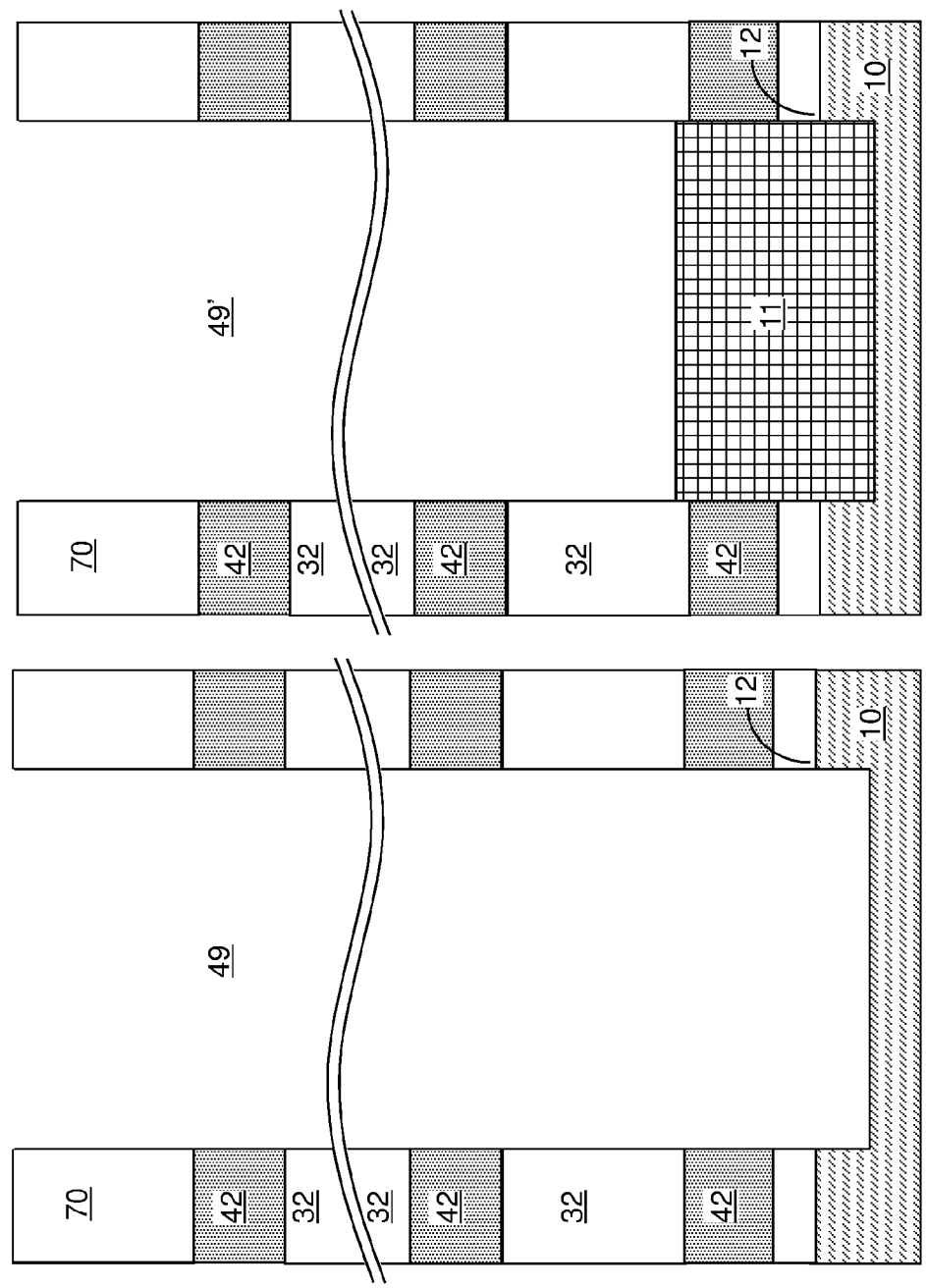

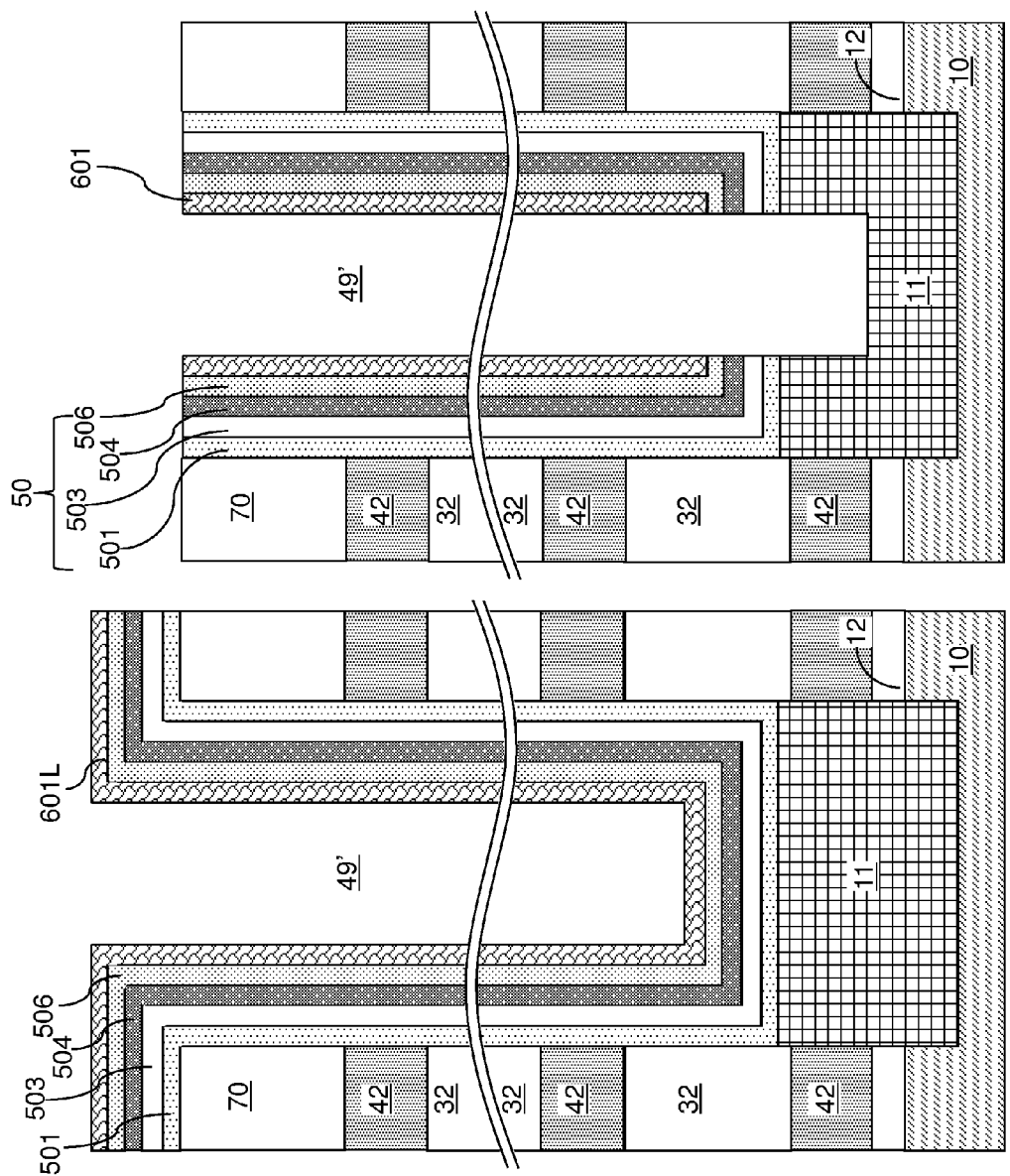

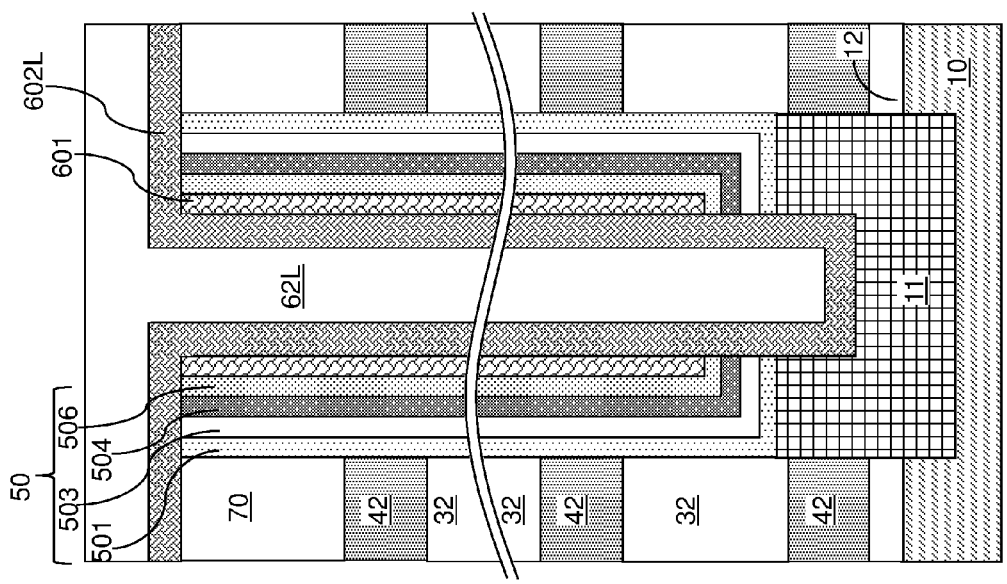
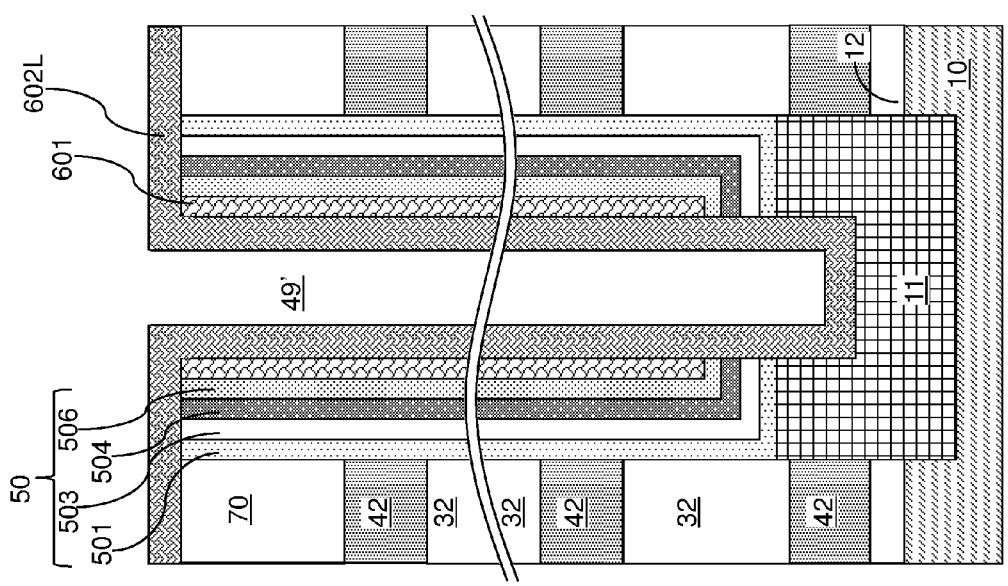

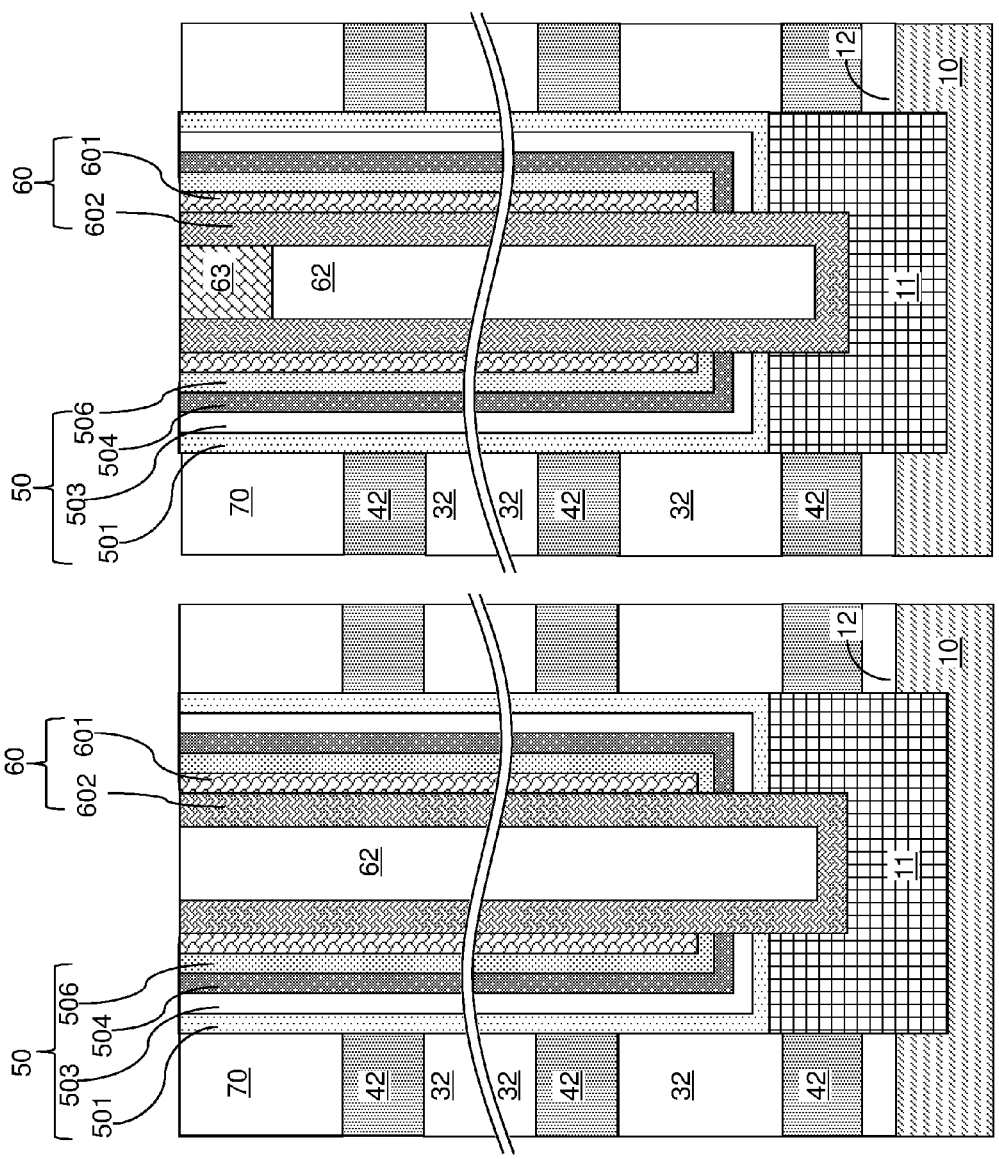

INTER-PLANE OFFSET IN BACKSIDE CONTACT VIA STRUCTURES FOR A THREE-DIMENSIONAL MEMORY DEVICE

FIELD

The present disclosure relates generally to the field of three-dimensional memory devices and specifically to three-dimensional memory devices including offset backside contact via structures and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; strings of memory stack structures, wherein each of the memory stack structures extends through the alternating stack and comprises a vertical stack of memory elements, a tunneling dielectric, and a vertical semiconductor channel; and backside contact via structures vertically extending through the alternating stack, extending generally along a first horizontal direction, and laterally separating neighboring pairs of strings of memory stack structures along a second horizontal direction that is perpendicular to the first horizontal direction. Each of the backside contact via structures includes multiple laterally extending portions that extend along the first horizontal direction and laterally offset along the second horizontal direction and adjoined by adjoining portions that laterally extend along a direction different from the first direction.

According to another aspect of the present disclosure, a method of forming a memory device, comprises forming an alternating stack of insulating layers and sacrificial layers over a substrate, forming strings of memory stack structures, wherein each of the memory stack structures extends through the alternating stack and comprises a vertical stack of memory elements, a tunneling dielectric, and a vertical semiconductor channel, and forming backside contact trenches through the alternating stack. The backside contact trenches laterally separate neighboring pairs of strings of memory stack structures along the second horizontal direction. Each of the backside contact trenches includes multiple laterally extending portions that extend along a first horizontal direction and laterally offset along a second horizontal direction that is perpendicular to the first horizontal direction and adjoined by adjoining portions that laterally extend along a direction different from the first direction. A first string among the strings of memory stack structures includes an outermost row of memory stack structures which extends from one end of the first string to an opposite end of the first string. The outermost row of memory stack structures is located along a substantially straight line extending parallel to the first horizontal direction. A region free of memory stack structures is provided between the outermost row of memory stack structures and a first backside contact trench among the backside contact trenches that is most proximal to the first string. The region free of memory stack structures has a first width adjacent to a first portion of the first backside contact trench which extends in the first horizontal direction and a second width greater than the first width adjacent to a second portion of the first backside contact trench which extends in the first horizontal direction. A distance between a side of the first backside contact trench and the outermost row of memory stack structures varies along a length of the first backside contact trench.

According to yet another aspect of the present disclosure, a three-dimensional memory device comprising a plurality of planes that are laterally spaced apart along a first horizontal direction is provided. Each of the plurality of planes comprises: a respective alternating stack of insulating layers and electrically conductive layers located over a substrate; strings of memory stack structures, wherein each of the memory stack structures extends through the respective alternating stack and comprises a vertical stack of memory elements, a tunneling dielectric, and a vertical semiconductor channel; and backside contact via structures vertically extending through the respective alternating stack, extending generally along the first horizontal direction, and laterally separating neighboring pairs of strings of memory stack structures along a second horizontal direction that is perpendicular to the first horizontal direction. A first plane among the plurality of planes includes a first plurality of strings that are laterally spaced apart along the second horizontal direction by a first plurality of backside contact via structures that are spaced apart by a backside contact via structure pitch. A second plane among the plurality of planes is located at a position laterally shifted from a position of the first plane along the first horizontal plane and includes a second plurality of strings that are laterally spaced apart along the second horizontal direction by a second plurality of backside contact via structures by the backside contact via structure pitch. The first plurality of backside contact via structures is laterally offset with respect the second plurality of backside contact via structures along the second horizontal direction.

According to still another aspect of the present disclosure, a method of forming a device structure is provided. An alternating stack of insulating layers and electrically conductive layers is formed over a substrate. Strings of memory stack structures are formed. Each of the memory stack structures extends through the alternating stack and comprises a vertical stack of memory elements, a tunneling dielectric, and a vertical semiconductor channel. Backside contact trenches vertically extending through the alternating stack are formed. The backside contact trenches extend generally along the first horizontal direction, and laterally separate neighboring pairs of strings of memory stack structures along a second horizontal direction that is perpendicular to the first horizontal direction. Backside contact via structures are formed in the backside contact trenches. A first plane among the plurality of planes includes a first plurality of strings that are laterally spaced apart along the second horizontal direction by a first plurality of backside contact via structures that are spaced apart by a backside contact via structure pitch. A second plane among the plurality of planes is located at a position laterally shifted from a position of the first plane along the first horizontal plane and includes a second plurality of strings that are laterally spaced apart along the second horizontal direction by a second plurality of backside contact via structures by the backside contact via structure pitch. The first plurality of backside contact via structures is laterally offset with respect the second plurality of backside contact via structures along the second horizontal direction.

BRIEF DESCRIPTION OF THE DRAWINGS

FIGS. 4A-4H are sequential schematic vertical cross-sectional views of a memory opening within the exemplary structure during various processing steps employed to form a memory stack structure according to an embodiment of the present disclosure.

DETAILED DESCRIPTION

Figure 1:
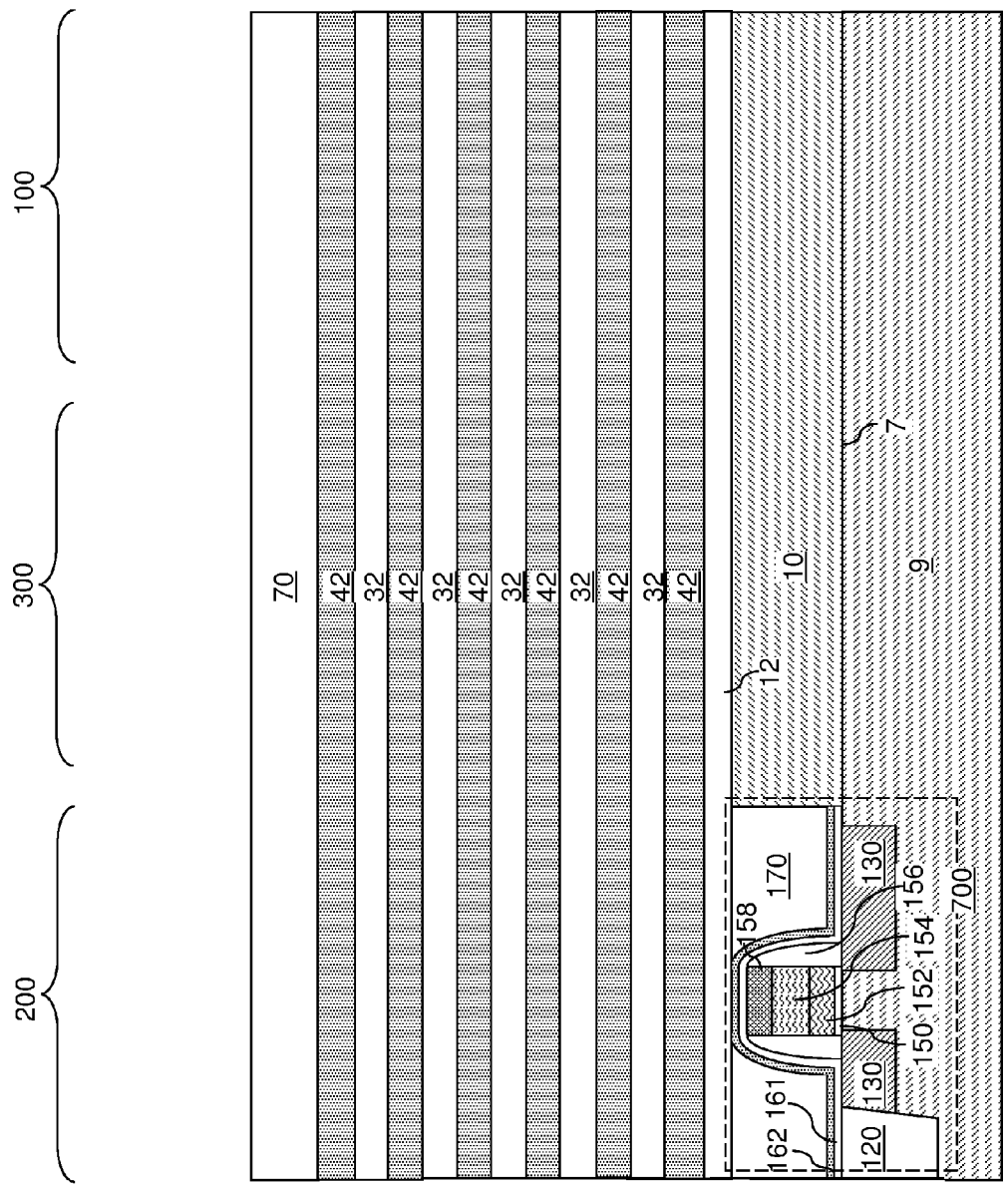
FIG. 1 is a schematic vertical cross-sectional view of an exemplary structure after formation of a stack including an alternating plurality of material layers according to an embodiment of the present disclosure.

As discussed above, the present disclosure is directed to three-dimensional memory devices including wiggled backside contact via structures and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (e.g., a p-type well, not expressly shown) can be formed within the substrate semiconductor layer 9 and/or the semiconductor material layer 10 located over the substrate semiconductor layer 9.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric 158. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

A stack of an alternating plurality of first material layers (which can be insulating layers 32) and second material layers (which can be sacrificial material layer 42) is formed over the top surface of the substrate, which can be, for example, on the top surface of the dielectric pad layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2:
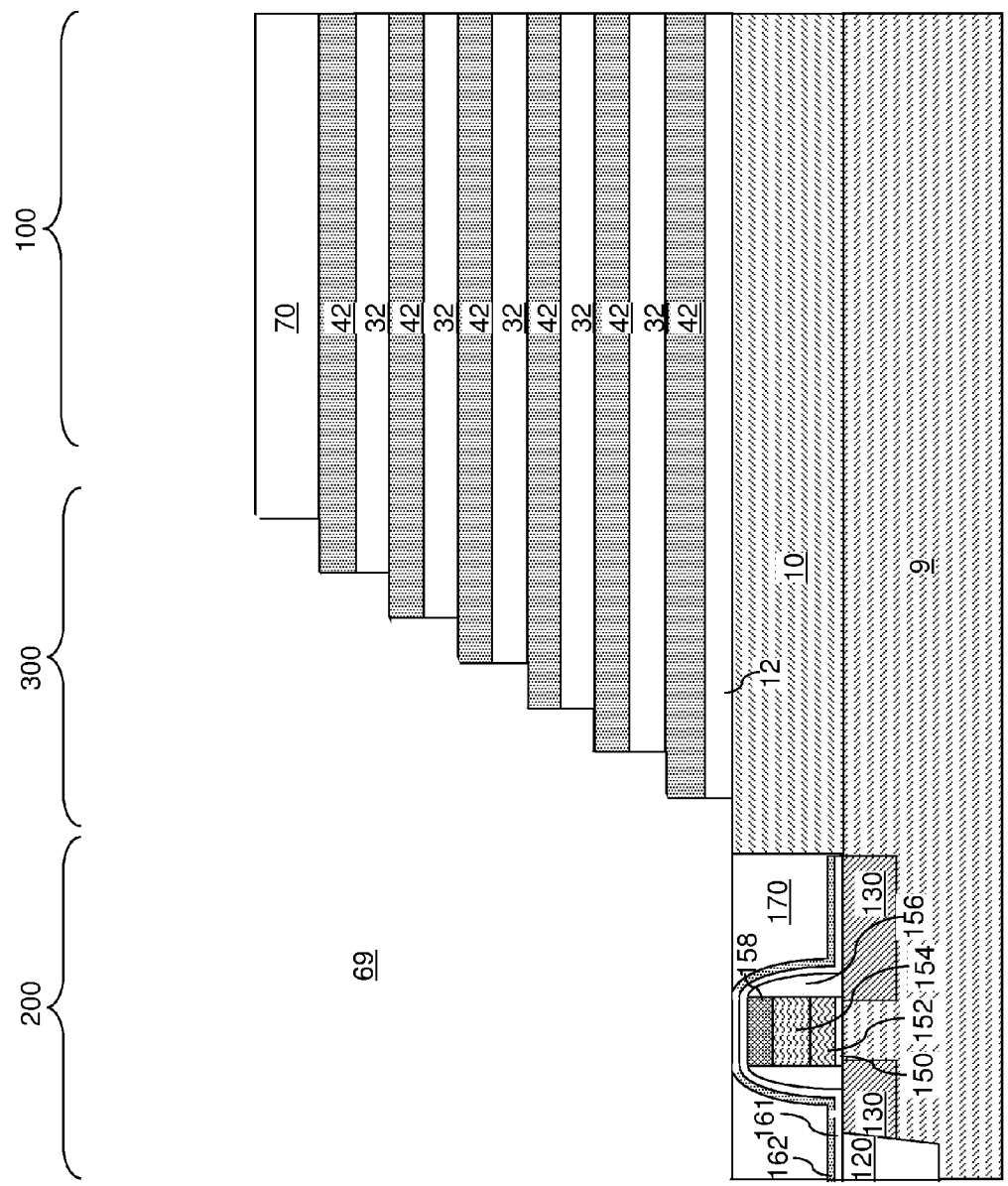
FIG. 2 is a schematic vertical cross-sectional view of the exemplary structure after formation of a terrace region on the stack according to an embodiment of the present disclosure.

Referring to FIG. 2, stepped terraces can be formed in the contact region 200. The stepped terraces can be formed by forming a stepped cavity within the contact region 300. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed applying and initially patterning a trimmable masking material layer, and by repetitively performing a set of processing steps. The set of processing steps can include, for example, an etch process of a first type (such as an anisotropic reactive ion etch) that vertically increases the depth of a cavity by one or more levels, and an etch process of a second type (referred to as a trimming process) that laterally expands the area to be vertically etched in a subsequent etch process of the first type. As used herein, a "level" of a structure including alternating plurality is defined as the relative position of a pair of a first material layer and a second material layer within the structure. A stepped cavity 69 can be formed in the peripheral device region 200 and the contact region 300.

Figure 3A:
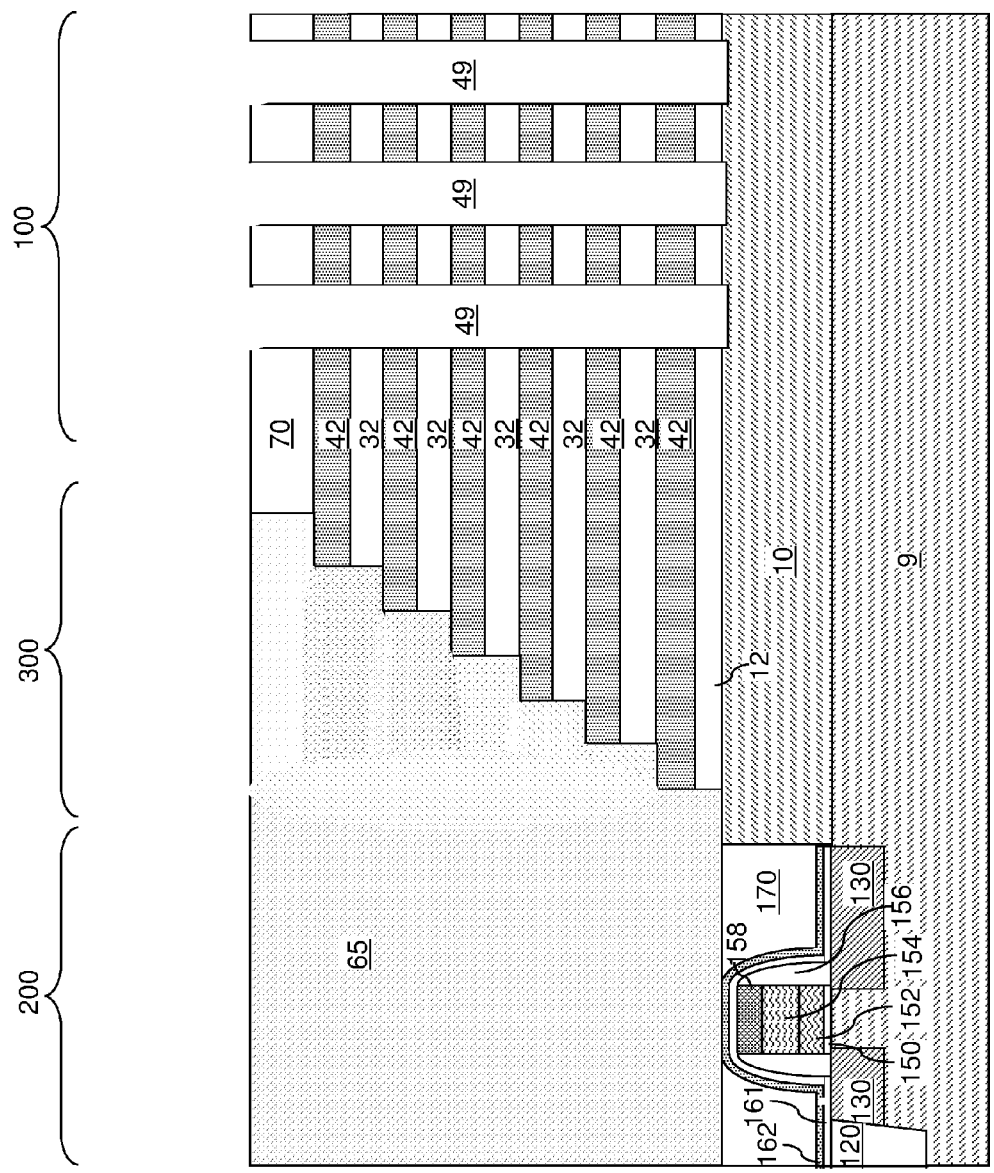
FIG. 3A is a schematic vertical cross-sectional view of the exemplary structure after formation of a retro-stepped dielectric material portion according to an embodiment of the present disclosure.
Figure 3B:
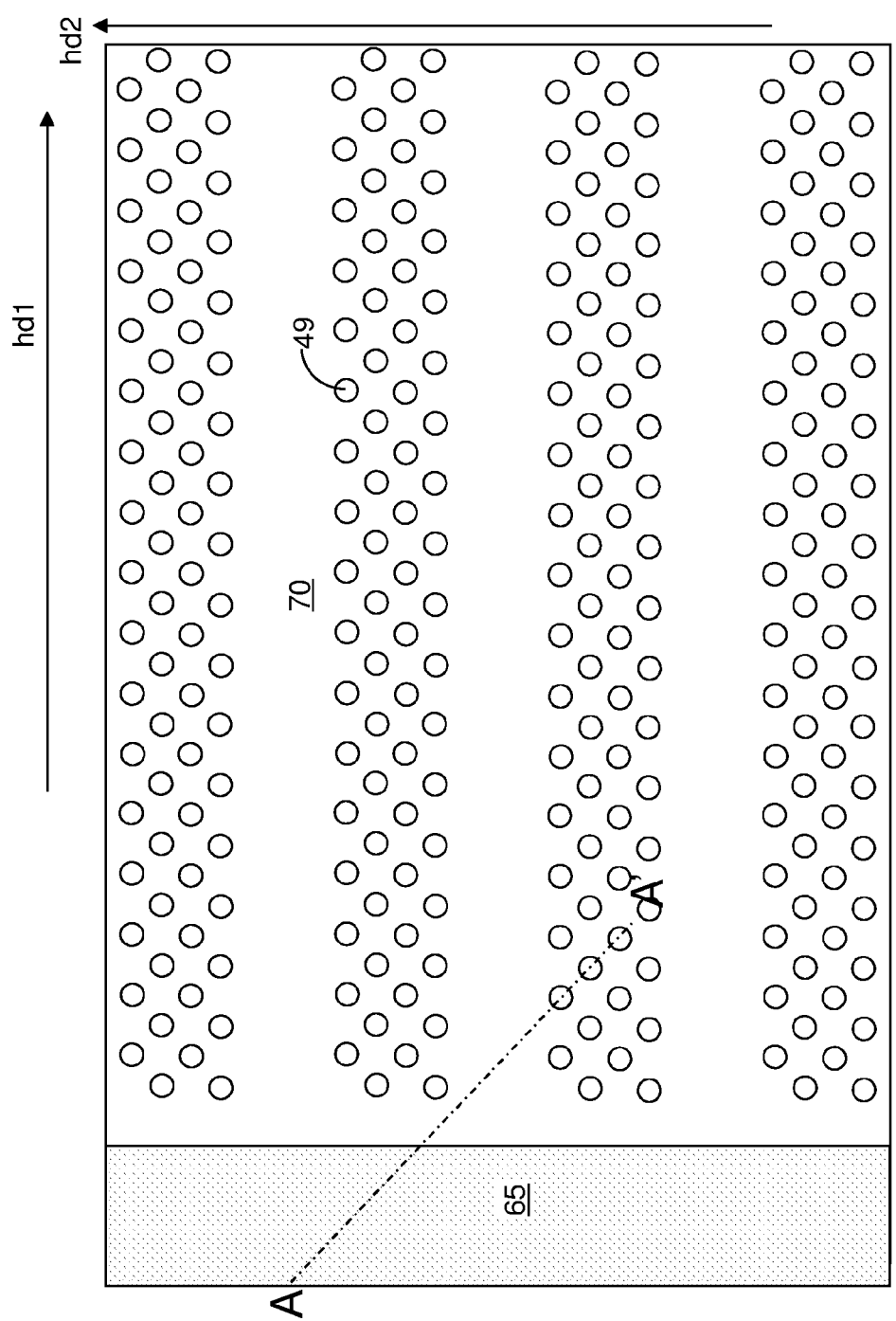
FIG. 3B is a top-down view of the exemplary structure of FIG. 3A.

Referring to FIGS. 3A and 3B, a retro-stepped dielectric material portion 65 (i.e., an insulating fill material portion) can be formed in the stepped cavity 69 by deposition of a dielectric material. A dielectric material such as silicon oxide can be deposited in the stepped cavity 65 by a conformal deposition process or a non-conformal deposition process. Excess portions of the deposited dielectric material can be removed from above the top surface of the insulating cap layer 70, for example, by chemical mechanical planarization (CMP). The remaining portion of the deposited dielectric material filling the stepped cavity 69 constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Subsequently, a lithographic material stack (not shown) including at least a photoresist layer can be formed over the insulating cap layer 70 and the retro-stepped dielectric material portion 65, and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 are formed through the dielectric pad layer 12 so that the memory openings 49 extend from the top surface of the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the substrate semiconductor layer 9.

The memory openings 49 can be arranged in groups that are laterally separated from one another along the second horizontal direction hd2. Each group of memory openings 49 spaced from neighboring groups along the second horizontal direction hd2 is herein referred to as a "string" of memory openings 49. A "string" as used herein may be a memory block or sub-block. A string corresponds to a memory block if the string is located between two backside trenches which extend through the entire alternating stack, as will be described below. A sting corresponds to a sub-block of a memory block if the string is located between a shallow trench and either another shallow trench or a backside trench described above. A shallow trench extends only through the drain select gate electrode levels (rather than through the entire alternating stack as the above described backside trench). Each string of memory openings 49 can generally extend along the first horizontal direction hd1. Each string of memory openings 49 can include multiple rows of memory openings 49 that extend along the first horizontal direction. The number of rows in each string of memory openings 49 can be in a range from 3 to 24, although lesser and greater numbers can also be employed. In one embodiment, each string of memory openings 49 can include a two dimensional periodic array of memory openings 49.

Referring to FIG. 4A, a memory opening 49 in the exemplary device structure of FIGS. 3A and 3B is illustrated. The memory opening 49 extends through the insulating cap layer 70, the alternating stack (32, 42), an optional dielectric cap layer 31, such as a silicon oxide layer, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 4B, an optional epitaxial channel portion (e.g., an epitaxial pedestal) 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 4C, a stack of layers including at least one blocking dielectric layer (501, 503), a charge storage layer 504, a tunneling dielectric layer 506, and an optional first semiconductor channel layer 601L can be sequentially deposited in the memory openings 49.

The at least one blocking dielectric layer (501, 503) can include a first blocking dielectric layer 501 and a second blocking dielectric layer 503. The first blocking dielectric layer 501 includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501 can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501 can be in a range from 1 nm to 20 nm, although lesser and greater thicknesses can also be employed. The first blocking dielectric layer 501 can subsequently function as a dielectric material portion that blocks leakage of stored electrical charges to control gate electrodes. In one embodiment, the first blocking dielectric layer 501 includes aluminum oxide.

The second blocking dielectric layer 503 can be formed on the first blocking dielectric layer 501. The second blocking dielectric layer 503 can include a dielectric material that is different from the dielectric material of the first blocking dielectric layer 501. In one embodiment, the second blocking dielectric layer 503 can include silicon oxide, a dielectric metal oxide having a different composition than the first blocking dielectric layer 501, silicon oxynitride, silicon nitride, or a combination thereof. In one embodiment, the second blocking dielectric layer 503 can include silicon oxide. The second blocking dielectric layer 503 can be formed by a conformal deposition method such as low pressure chemical vapor deposition, atomic layer deposition, or a combination thereof. The thickness of the second blocking dielectric layer 503 can be in a range from 1 nm to 20 nm, although lesser and greater thicknesses can also be employed. Alternatively, the first blocking dielectric layer 501 and/or the second blocking dielectric layer 503 can be omitted, and a blocking dielectric layer can be formed after formation of backside recesses on surfaces of memory films to be subsequently formed.

Subsequently, the charge storage layer 504 can be formed. In one embodiment, the charge storage layer 504 can be a continuous layer or patterned discrete portions of a charge trapping material including a dielectric charge trapping material, which can be, for example, silicon nitride. Alternatively, the charge storage layer 504 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 504 includes a silicon nitride layer. In one embodiment, the sacrificial material layers 42 and the insulator layers 32 can have vertically coincident sidewalls, and the charge storage layer 504 can be formed as a single continuous layer.

In another embodiment, the sacrificial material layers 42 can be laterally recessed with respect to the sidewalls of the insulator layers 32, and a combination of a deposition process and an anisotropic etch process can be employed to form the charge storage layer 504 as a plurality of memory material portions that are vertically spaced apart. While the present disclosure is described employing an embodiment in which the charge storage layer 504 is a single continuous layer, embodiments are expressly contemplated herein in which the charge storage layer 504 is replaced with a plurality of memory material portions (which can be charge trapping material portions or electrically isolated conductive material portions) that are vertically spaced apart.

The charge storage layer 504 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 504 may comprise an insulating charge trapping material, such as one or more silicon nitride segments. Alternatively, the charge storage layer 504 may comprise conductive nanoparticles such as metal nanoparticles, which can be, for example, ruthenium nanoparticles. The charge storage layer 504 can be formed, for example, by chemical vapor deposition (CVD), atomic layer deposition (ALD), physical vapor deposition (PVD), or any suitable deposition technique for storing electrical charges therein. The thickness of the charge storage layer 504 can be in a range from 2 nm to 20 nm, although lesser and greater thicknesses can also be employed.

The tunneling dielectric layer 506 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506 can include a stack of a first silicon oxide layer, a silicon oxynitride layer, and a second silicon oxide layer, which is commonly known as an ONO stack. In one embodiment, the tunneling dielectric layer 506 can include a silicon oxide layer that is substantially free of carbon or a silicon oxynitride layer that is substantially free of carbon. The thickness of the tunneling dielectric layer 506 can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501, 503, 504, 506, 601L).

Referring to FIG. 4D, the optional first semiconductor channel layer 601L, the tunneling dielectric layer 506L, the charge storage layer 504, the at least one blocking dielectric layer (501, 503) are sequentially anisotropically etched employing at least one anisotropic etch process. The portions of the first semiconductor channel layer 601, the tunneling dielectric layer 506, the charge storage layer 504, and the at least one blocking dielectric layer (501, 503) located above the top surface of the insulating cap layer 70 can be removed by the at least one anisotropic etch process. Further, the horizontal portions of the first semiconductor channel layer 601L, the tunneling dielectric layer 506, the charge storage layer 504, and the at least one blocking dielectric layer (501, 503) at a bottom of each cavity 49' can be removed to form openings in remaining portions thereof. Each of the first semiconductor channel layer 601L, the tunneling dielectric layer 506, the charge storage layer 504, and the at least one blocking dielectric layer (501, 503) can be etched by anisotropic etch process.

Each remaining portion of the first semiconductor channel layer 601L constitutes a first semiconductor channel portion 601. The charge storage layer 504 can comprise a charge trapping material or a floating gate material. In one embodiment, each charge storage layer 504 can include a vertical stack of charge storage regions that store electrical charges upon programming. In one embodiment, the charge storage layer 504 can be a charge storage layer in which each portion adjacent to the sacrificial material layers 42 constitutes a charge storage region. Each remaining portion of the second blocking dielectric layer 503 is herein referred to as a second blocking dielectric layer 503. Each remaining portion of the first blocking dielectric layer 501 is herein referred to as a first blocking dielectric layer 501.

A surface of the epitaxial channel portion 11 (or a surface of the semiconductor substrate layer 10 in case the epitaxial channel portions 11 are not employed) can be physically exposed underneath the opening through the first semiconductor channel portion 601, the tunneling dielectric layer 506, the charge storage layer 504, and the at least one blocking dielectric layer (501, 503). Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 506 is located over the charge storage layer 504. A set of at least one blocking dielectric layer (501, 503), a charge storage layer 504, and a tunneling dielectric layer 506 in a memory opening 49 constitutes a memory film 50, which includes a plurality of charge storage regions (as embodied as the charge storage layer 504) that are insulated from surrounding materials by the at least one blocking dielectric layer (501, 503) and the tunneling dielectric layer 506. In one embodiment, the first semiconductor channel portion 601, the tunneling dielectric layer 506, the charge storage layer 504, the second blocking dielectric layer 503, and the first blocking dielectric layer 501 can have vertically coincident sidewalls.

Referring to 4E, a second semiconductor channel layer 602L can be deposited directly on the semiconductor surface of the epitaxial channel portion 11 or the semiconductor substrate layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 4F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 4G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric layer 506 is surrounded by a charge storage layer 504, and laterally surrounds a portion of the semiconductor channel 60. Each adjoining set of a first blocking dielectric layer 501, a second blocking dielectric layer 503, a charge storage layer 504, and a tunneling dielectric layer 506 collectively constitute a memory film 50, which can store electrical charges with a macroscopic retention time. In some embodiments, a first blocking dielectric layer 501 and/or a second blocking dielectric layer 503 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 4H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 5:
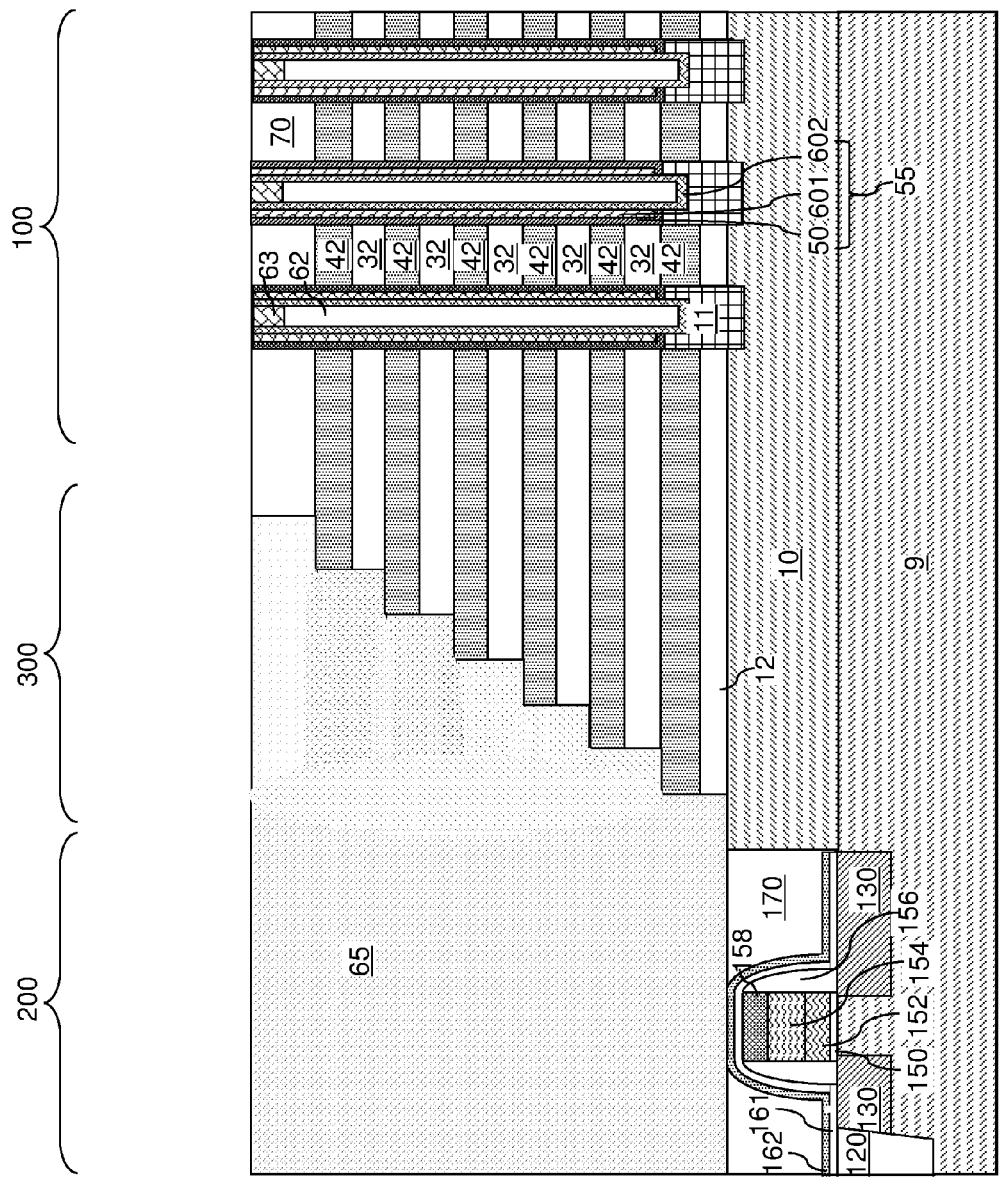
FIG. 5 is a schematic vertical cross-sectional view of the exemplary structure after formation of memory stack structures according to an embodiment of the present disclosure.

The exemplary memory stack structure 55 can be embedded into the exemplary structure illustrated in FIGS. 3A and 3B. FIG. 5 illustrates the exemplary structure that incorporates multiple instances of the exemplary memory stack structure of FIG. 4H. Each exemplary memory stack structure 55 includes a semiconductor channel 60 which may comprise layers (601, 602) and a memory film 50. The memory film 50 may comprise a tunneling dielectric layer 506 laterally surrounding the semiconductor channel 60 and a vertical stack of charge storage regions laterally surrounding the tunneling dielectric layer 506 (as embodied as a memory material layer 504) and an optional blocking dielectric (e.g., 501, 503). The exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor material layer 10), and a memory opening extending through the stack (32, 42). The semiconductor device further comprises a first blocking dielectric layer 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 6:
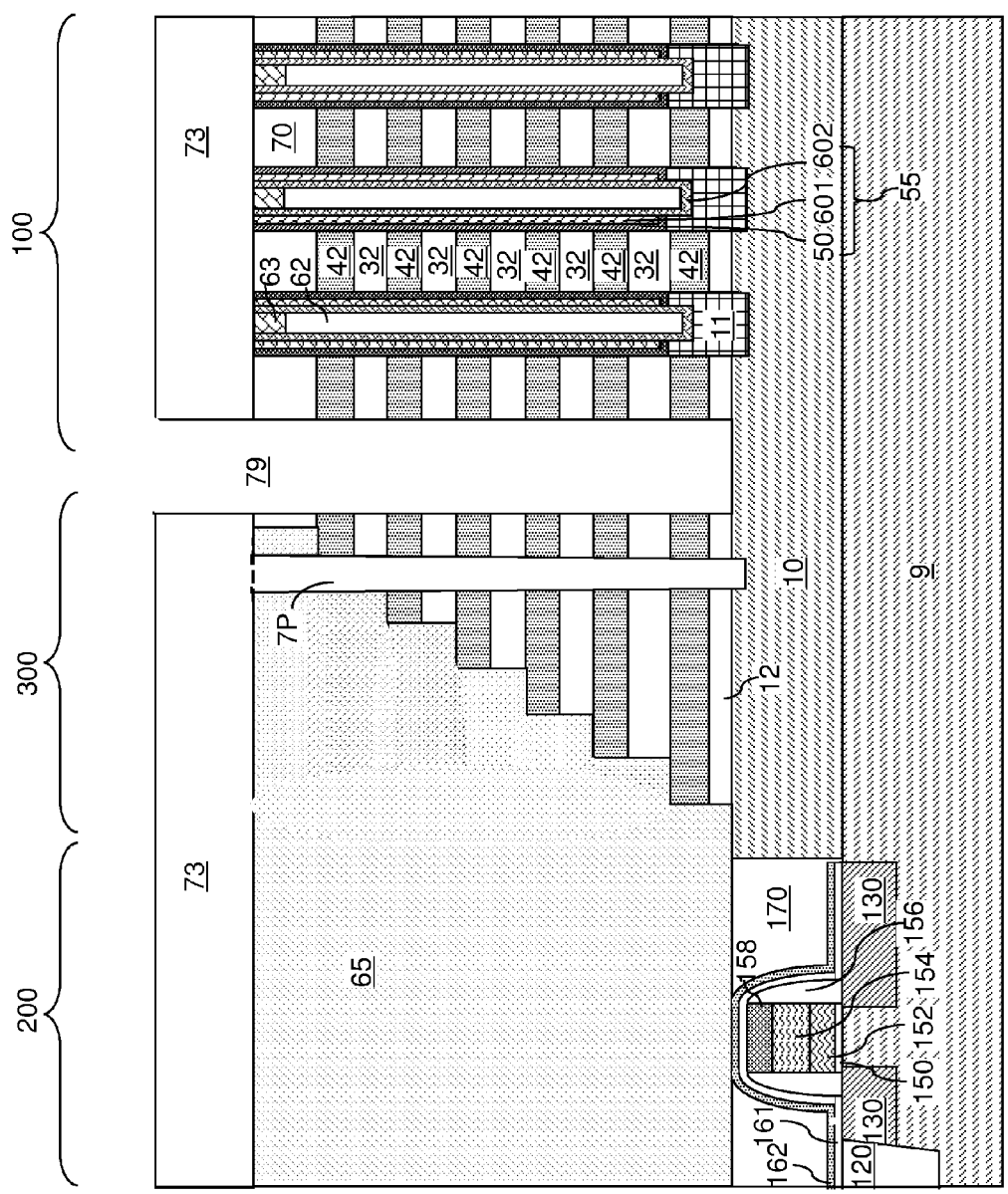
FIG. 6 is a schematic vertical cross-sectional view of the exemplary structure after formation of backside contact trenches according to an embodiment of the present disclosure.

Referring to FIG. 6, at least one dielectric support pillar 7P may be optionally formed through the retro-stepped dielectric material portion 65 and/or through the insulating cap layer 70 and/or through the alternating stack (32, 42). In one embodiment, the at least one dielectric support pillar 7P can be formed in the contact region 300, which is located adjacent to the memory array region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the at least one dielectric support pillar 7P may be formed concurrently with formation of memory stack structures 55, the dielectric cores 62, and the drain regions 63. In this case, each dielectric support pillar 7P can have the same material composition as a combination of a memory stack structure 55, a dielectric core 62, and a drain region 63. In one embodiment, the portion of the dielectric material that is deposited over the insulating cap layer 70 concurrently with deposition of the at least one dielectric support pillar 7P can be present over the insulating cap layer 70 as a contact level dielectric layer 73. Each of the at least one dielectric support pillar 7P and the contact level dielectric layer 73 is an optional structure. As such, the contact level dielectric layer 73 may, or may not, be present over the insulating cap layer 70 and the retro-stepped dielectric material portion 65. Alternatively, formation of the contact level dielectric layer 73 may be omitted, and at least one via level dielectric layer may be subsequently formed, i.e., after formation of a backside contact via structure.

The contact level dielectric layer 73 and the at least one dielectric support pillar 7P can be formed as a single continuous structure of integral construction, i.e., without any material interface therebetween. In another embodiment, the portion of the dielectric material that is deposited over the insulating cap layer 70 concurrently with deposition of the at least one dielectric support pillar 7P can be removed, for example, by chemical mechanical planarization or a recess etch. In this case, the contact level dielectric layer 73 is not present, and the top surface of the insulating cap layer 70 can be physically exposed.

A photoresist layer (not shown) can be applied over the alternating stack (32, 42), and is lithographically patterned to form at least one elongated opening in each area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed.

Multiple instances of the backside contact trench 79 can be formed, which generally extend along a first horizontal direction hd1. FIGS. 7A-7F illustrate various exemplary configurations that can be employed for the pattern of the backside contact trenches 79. As used herein, an element "generally extends along" a first direction if the element extends along the first direction by a first lateral extent that is at least four times greater than the maximum extent of the element along a second direction that is perpendicular to the first direction. In the case of the backside contact trenches 79 illustrated in FIGS. 7A-7F, each of the backside contact trenches 79 extends along the first horizontal direction hd1 by a first lateral extent that is greater than 4 times (e.g. at least 10 times, such as 10 to 50 times) the maximum extent of each of the backside contact trenches 79 along a second horizontal direction hd2 that is perpendicular to the first horizontal direction hd1. Each of the backside contact trenches 79 includes "wiggles" along the second horizontal direction hd2, which refers to lateral displacement along the second horizontal direction hd2 of one portion of a backside contact trench 79 that extends along the first horizontal direction hd1 with respect to another portion of the backside contact trench 79 that extends along the first horizontal direction hd1. In one embodiment, the distance of the lateral displacement along the second horizontal direction hd2 can be less than the length of each portion of the backside contact trench 79 extending along the first horizontal direction hd1.

FIGS. 7A, 7B, 7C, 7D, 7E, and 7F illustrate first, second, third, fourth, fifth, and sixth exemplary geometries for the backside contact trenches 79 according to various embodiments of the present disclosure. The exemplary geometries expressly described herein are not intended to be an exhaustive list of geometries for the backside contact trenches 79 for implementation of the present disclosure, but are merely intended as illustrative examples for describing the guiding principles for implementing the present disclosure. As such, numerous variations of the disclosed geometries can be implemented without deviating from the spirit of the present disclosure.

The backside contact trenches 79 extend through the alternating stack of insulating layers 32 and electrically conductive layers 46. The backside contact trenches 79 vertically extend through the alternating stack (32, 42), and laterally separate neighboring pairs of strings of memory stack structures 55 along the second horizontal direction hd2. Each of the backside contact trenches 79 includes multiple laterally extending portions (such as a first backside contact trench portion TR1 and a second backside contact trench portion TR2 illustrated in FIGS. 7A-7F) that extend along a first horizontal direction hd1 and laterally offset along a second horizontal direction hd2 that is perpendicular to the first horizontal direction hd1 and adjoined to each other by adjoining portions (such as a third trench portion TR3 illustrated in FIGS. 7A-7F) that laterally extend along a direction different from the first direction hd1 (such as the second horizontal direction hd2 as illustrated in FIGS. 7A-7D or an oblique (e.g., diagonal) direction between the first and second horizontal directions (hd1, hd2) as illustrated in FIGS. 7E and 7F). Portion TR3 connects the ends of portions TR1 and TR2.

In some embodiments, a first string S1 among the strings of memory stack structures 55 includes an outermost row RO of memory stack structures 55 located along a straight line extending parallel to the first horizontal direction hd1. A region RF free of memory stack structures 55 can be provided between a backside contact trench 79 among the backside contact trenches 79 that is most proximal to the first string S1 and the outermost row RO of memory stack structures 55. In some embodiments shown in FIGS. 7A, 7B, 7D and 7E, the outermost row RO of memory stack structures 55 comprises a substantially straight line which extends from one end of the string to the opposite end of the string (i.e., from one end of the contact trench 79 to the opposite end of the contact trench 79 in the memory array region 100). A substantially straight line is a line which is exactly straight or which includes unavoidable deviations from the exactly straight line due to lithography variations used to pattern the memory openings 49 in which the memory stack structures 55 are located. In this case, the region RF free of memory stack structures 55 has a first width ld1 adjacent to portion TR1 of the contact trench 79 and a greater width ld2 adjacent to portion TR2 of the same contact trench 79. In other words, the distance between the side of the contact trench 79 and the nearest (i.e., outer) memory stack structure row RO varies along the length of the contact trench 79.

In some embodiments, the backside contact trench 79 that is most proximal to the first string S1 can comprise a first backside contact trench portion TR1 that is spaced from the outermost row RO of memory stack structures 55 by a first distance ld1 along the second horizontal direction hd2, and a second backside contact trench portion TR2 that is spaced from the outermost row RO of memory stack structures 55 by a second distance ld2 along the second horizontal direction hd2 (where the first distance is different than the second distance). In some embodiments, a first subset of at least two memory stack structures 55 within the outermost row RO of memory stack structures can be laterally spaced from the first backside contact trench portion TR1 by the first distance ld1, and a second subset of at least two other memory stack structures 55 within the outermost row RO of memory stack structures 55 can be laterally spaced from the second backside contact trench portion TR2 by the second distance ld2.

In some embodiments, such as the embodiments illustrated in FIGS. 7A-7D, the first backside contact trench portion TR1 and the second backside contact trench portion TR2 can be adjoined to each other by a third backside contact trench portion TR3 that laterally extends along the second horizontal direction hd2 by a distance greater than the width of the first backside contact trench portion TR1. In some embodiments, each backside contact trench portion (TR1, TR2) laterally extending along the first horizontal direction can have the same width as each other, and each backside contact trench portion TR3 laterally extending along the second horizontal direction hd2 can have the same width as portions TR1 and TR2.

In some embodiments such as the embodiments illustrated in FIGS. 7E and 7F, the first backside contact trench portion TR1 and the second backside contact trench portion TR2 are adjoined to each other by a third backside contact trench portion TR3 that laterally extends along a third horizontal direction between the first horizontal direction hd1 and the second horizontal direction hd2 by a distance greater than a width of the first backside contact trench portion TR1. As used herein, all widths of elements are measured along a direction perpendicular to the lengthwise direction of the respective element.

Figure 7A:
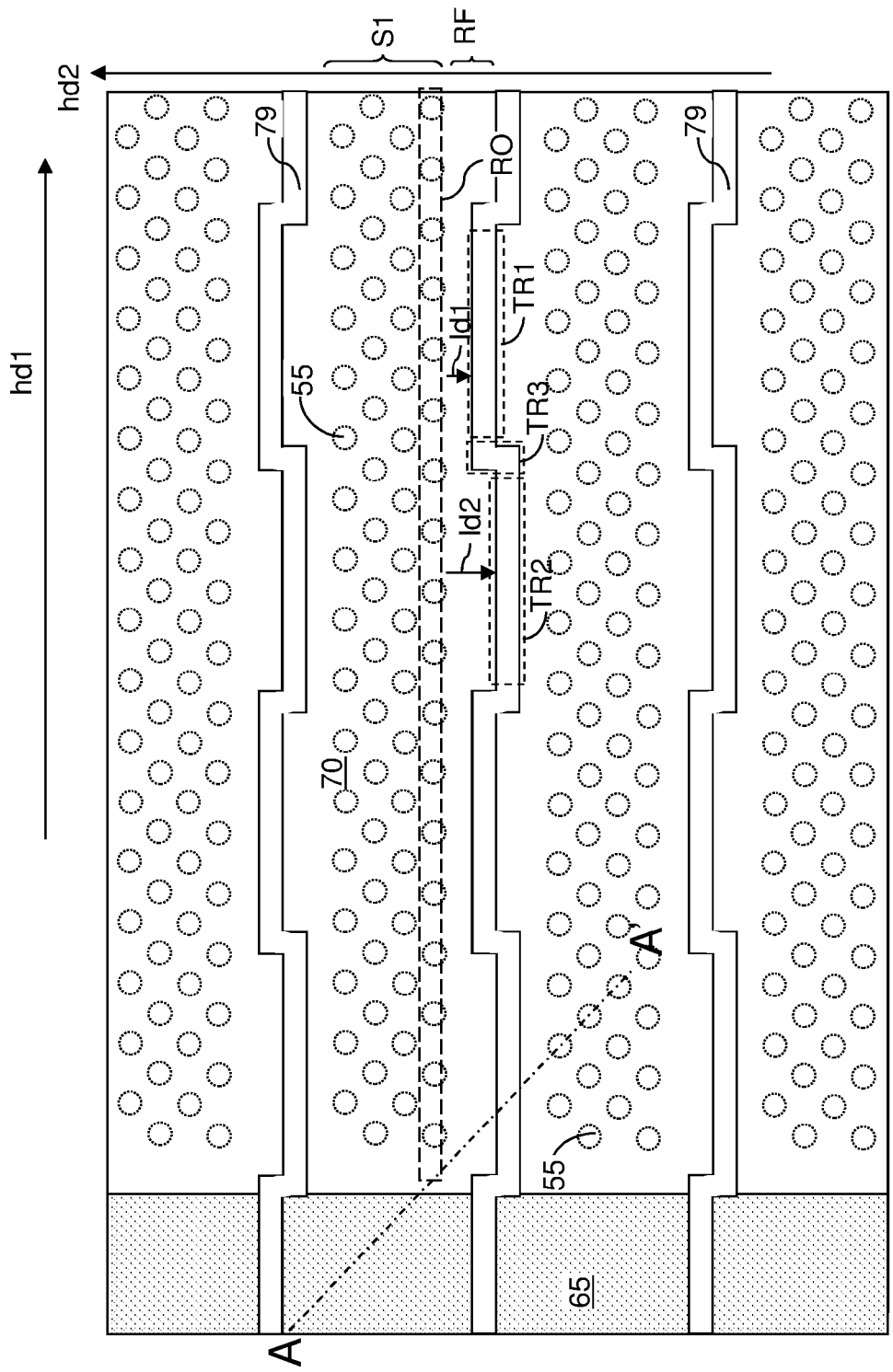
FIG. 7A is a top-down view of the exemplary structure of FIG. 6 for the case of a first exemplary geometry for the backside contact trenches according to an embodiment of the present disclosure. The vertical plane A-A' corresponds to the plane of the schematic vertical cross-sectional view of FIG. 6.
Figure 7B:
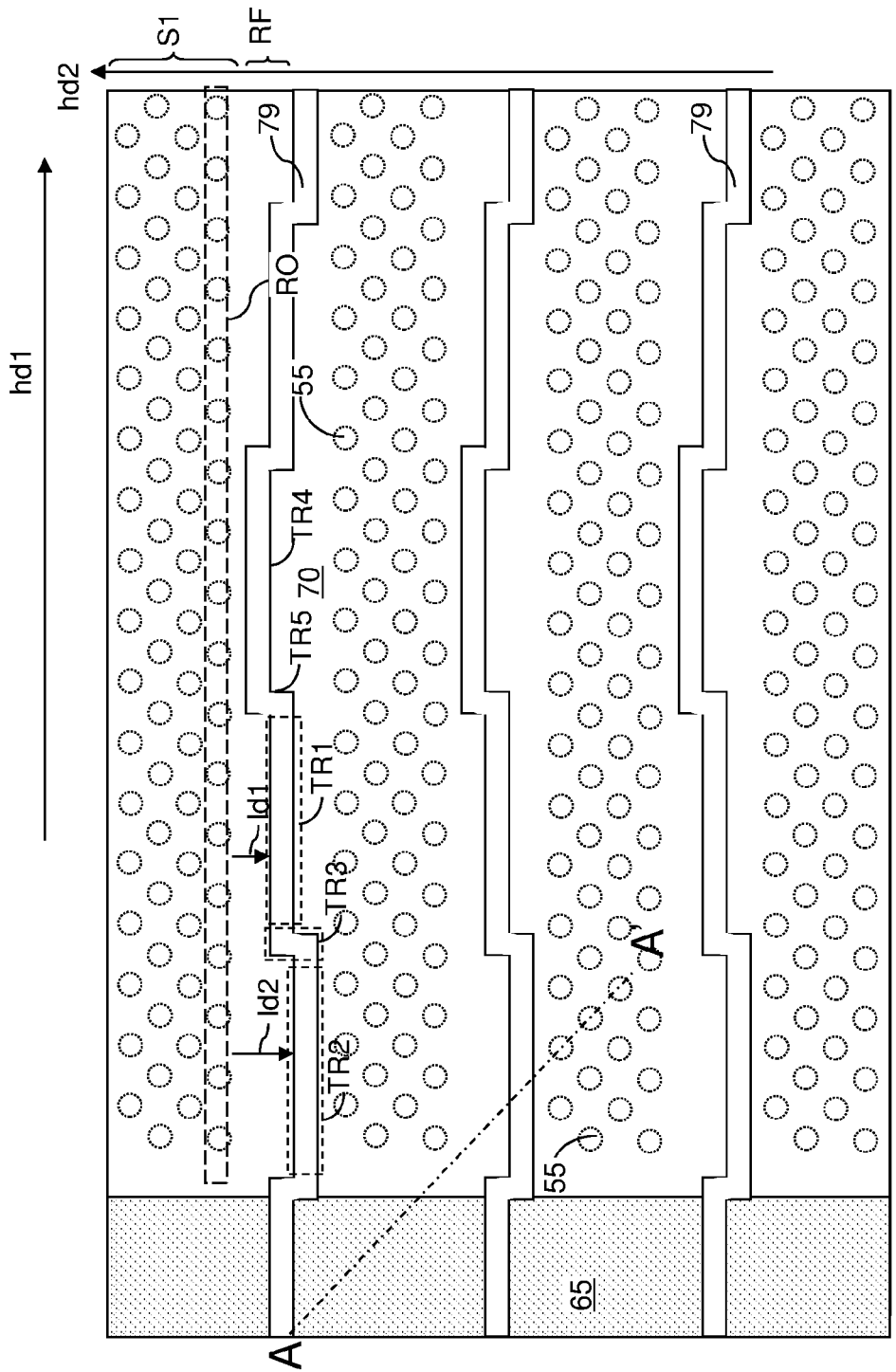
FIG. 7B is a top-down view of the exemplary structure of FIG. 6 for the case of a second exemplary geometry for the backside contact trenches according to an embodiment of the present disclosure. The vertical plane A-A' corresponds to the plane of the schematic vertical cross-sectional view of FIG. 6.
Figure 7C:
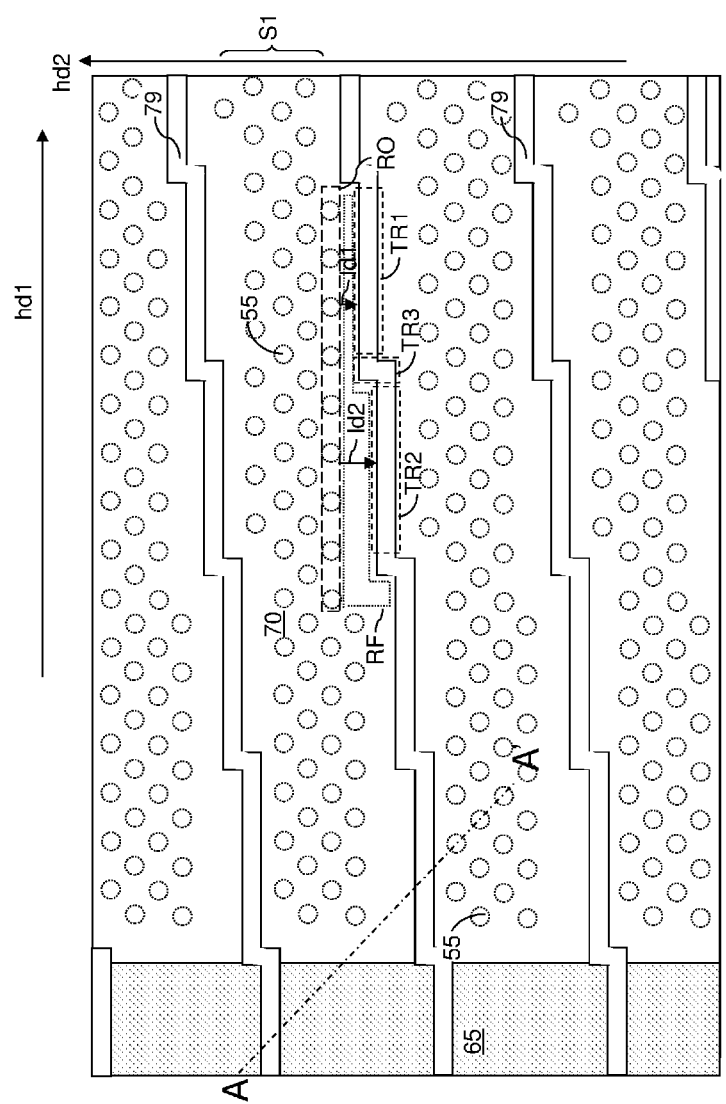
FIG. 7C is a top-down view of the exemplary structure of FIG. 6 for the case of a third exemplary geometry for the backside contact trenches according to an embodiment of the present disclosure. The vertical plane A-A' corresponds to the plane of the schematic vertical cross-sectional view of FIG. 6.
Figure 7D:
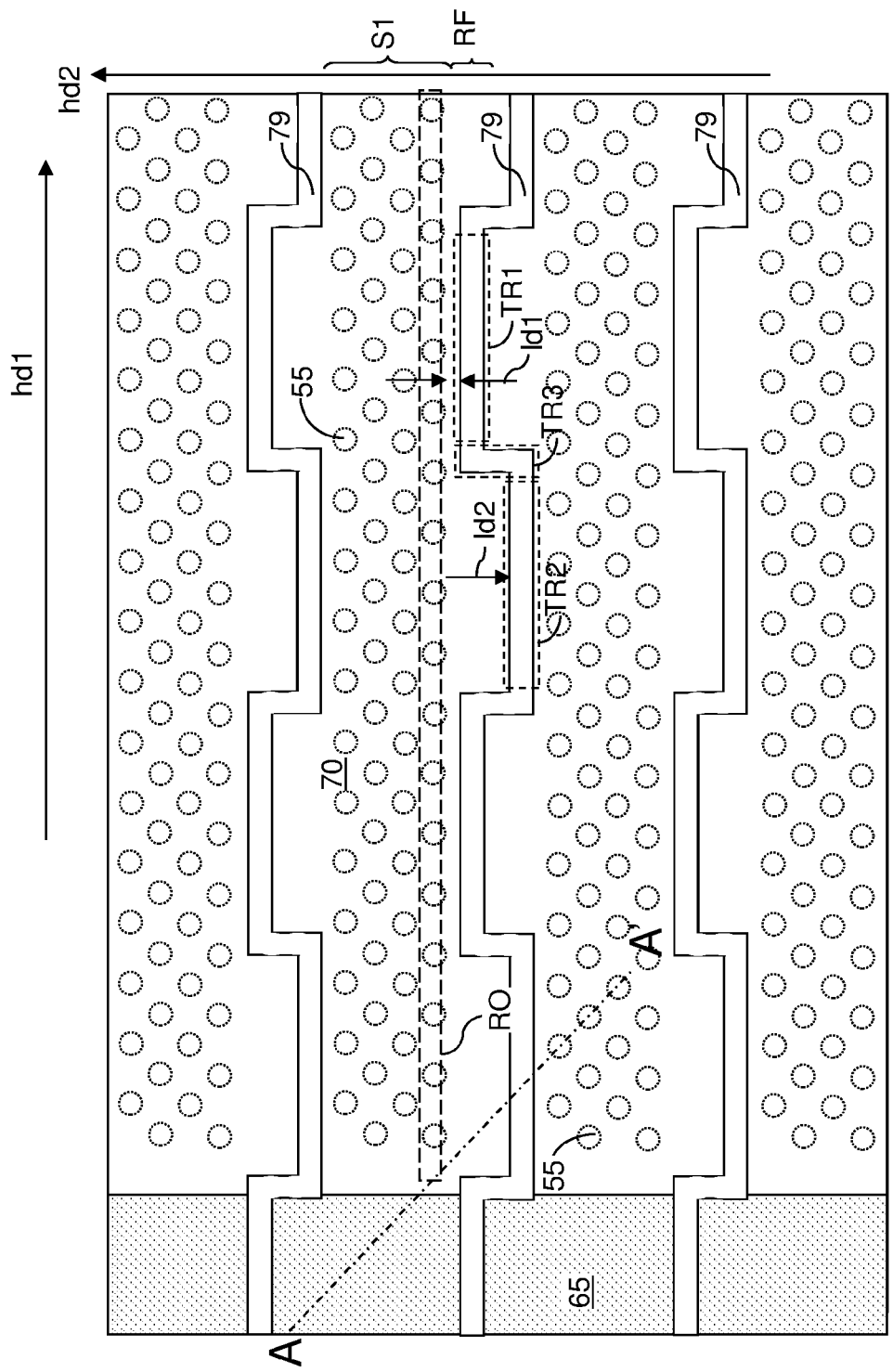
FIG. 7D is a top-down view of the exemplary structure of FIG. 6 for the case of a fourth exemplary geometry for the backside contact trenches according to an embodiment of the present disclosure. The vertical plane A-A' corresponds to the plane of the schematic vertical cross-sectional view of FIG. 6.
Figure 7E:
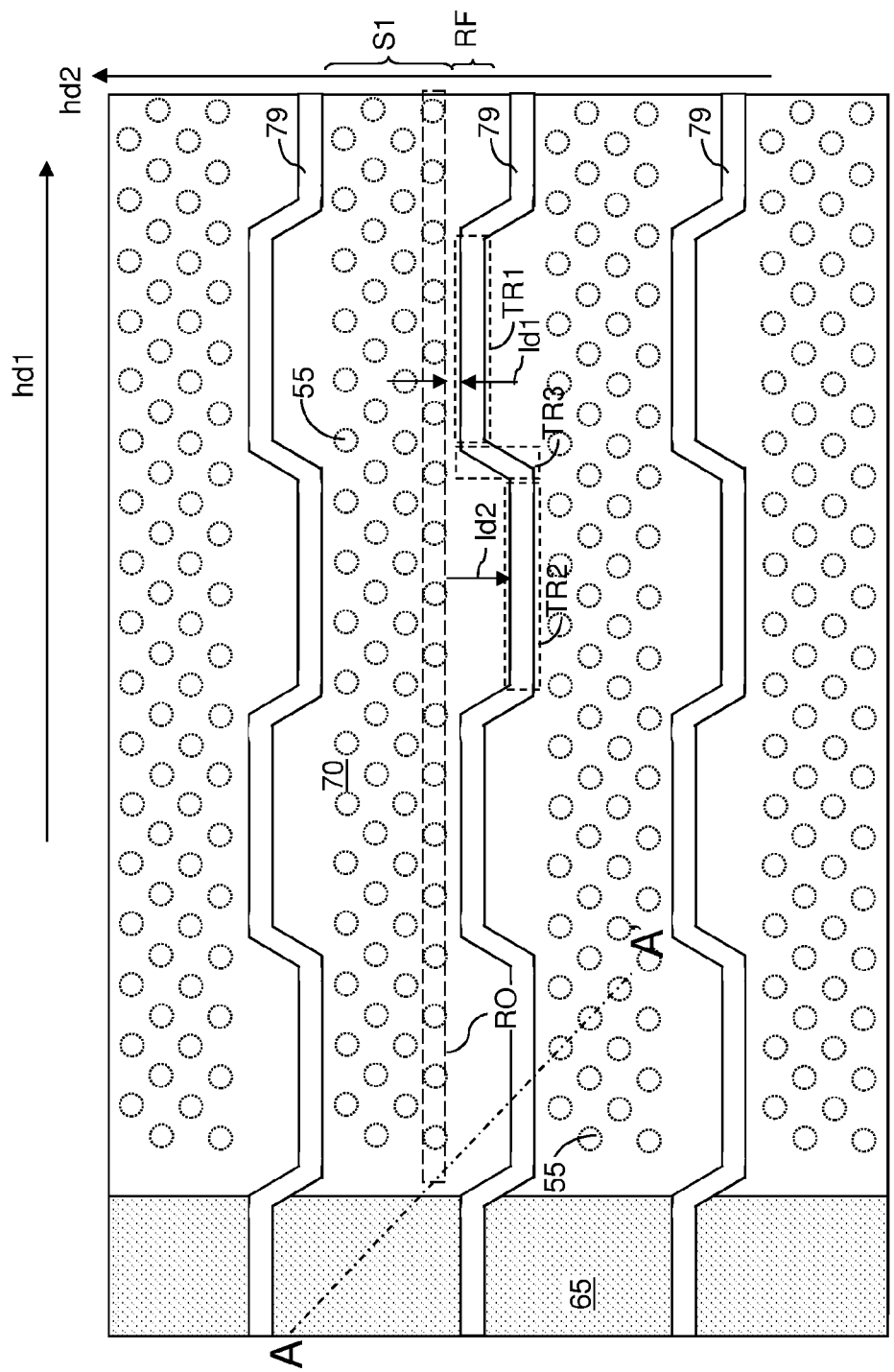
FIG. 7E is a top-down view of the exemplary structure of FIG. 6 for the case of a fifth exemplary geometry for the backside contact trenches according to an embodiment of the present disclosure. The vertical plane A-A' corresponds to the plane of the schematic vertical cross-sectional view of FIG. 6.
Figure 7F:
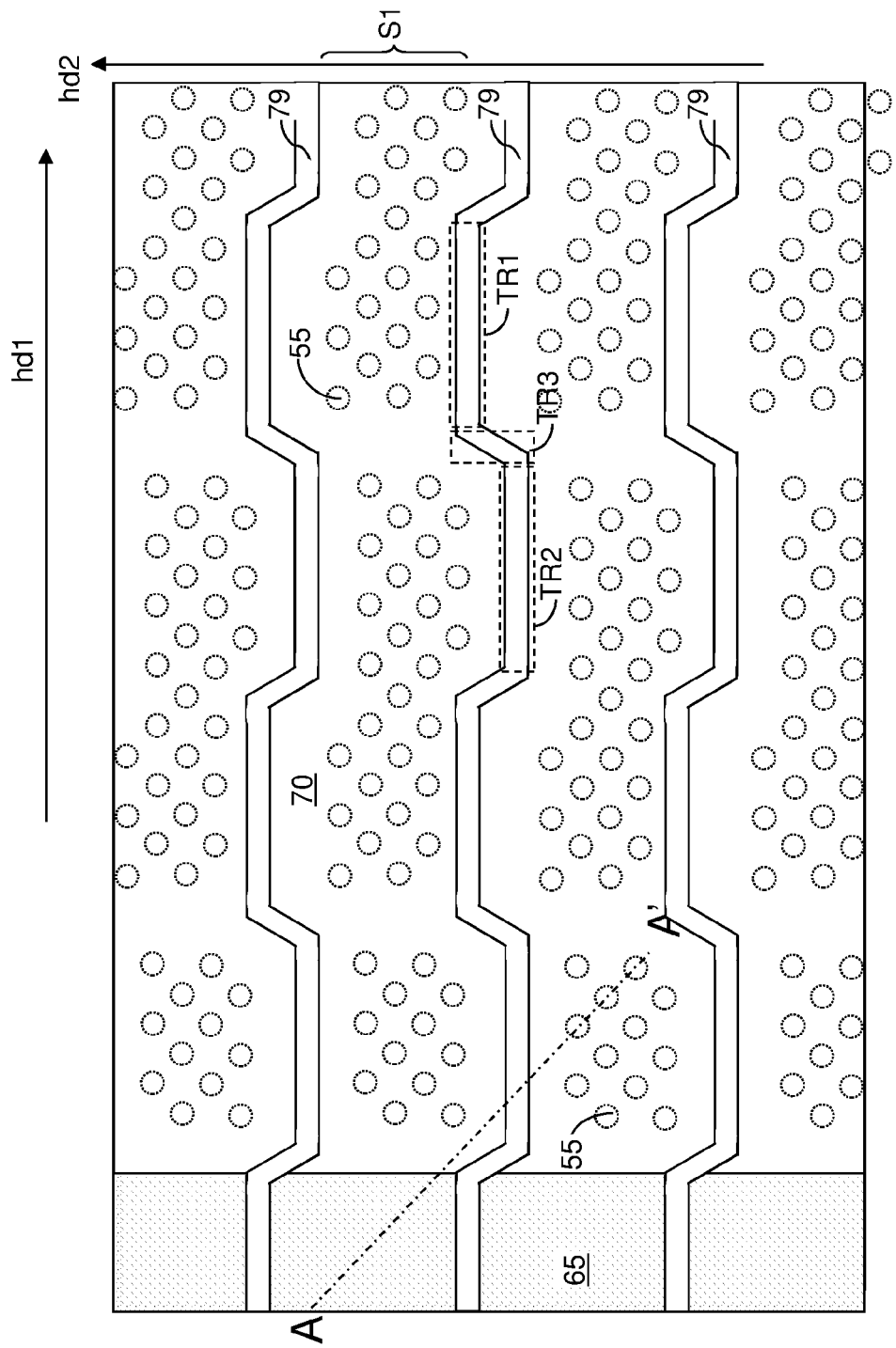
FIG. 7F is a top-down view of the exemplary structure of FIG. 6 for the case of a sixth exemplary geometry for the backside contact trenches according to an embodiment of the present disclosure. The vertical plane A-A' corresponds to the plane of the schematic vertical cross-sectional view of FIG. 6.

In some embodiments such as the embodiments illustrated in FIGS. 7B and 7C, the backside contact trench 79 that is most proximal to the first string S1 can include at least three (e.g., at least four) laterally extending portions that extend along the first horizontal direction hd1 and at least two (e.g., at least three) adjoining portions that connect a neighboring pair of laterally extending portions. In other words, as shown in FIG. 7B, at least two portions (e.g., TR1 and TR2) which extend in the first horizontal direction hd1 and which are connected to each other by portion (e.g., TR3) which does not extend in the first horizontal direction are offset in the same horizontal direction (e.g., in the direction of arrows ld1 and ld2) from a third portion (e.g., TR4) which extends in the first horizontal direction hd1 and which is connected to the at least two portions (e.g., TR1 and TR2) by another portion (e.g., TR5) which does not extend in the first horizontal direction. In the embodiment shown in FIG. 7C, that the entire backside contact trench 79 that is most proximal to the first string S1 generally extends at an oblique angle (e.g., greater than zero and less than 90 degrees, such as 20 to 70 degrees) relative to the first horizontal direction hd1.

In some embodiment, the backside contact trench 79 that is most proximal to the first string S1 can include more than four laterally extending portions that extend along the first horizontal direction hd1 and more than three adjoining portions that connect a neighboring pair of laterally extending portions such that the backside contact trench 79 that is most proximal to the first string S1 generally extends along the first horizontal direction hd1 with periodic lateral deviations along the second horizontal direction hd2.

Figure 8:
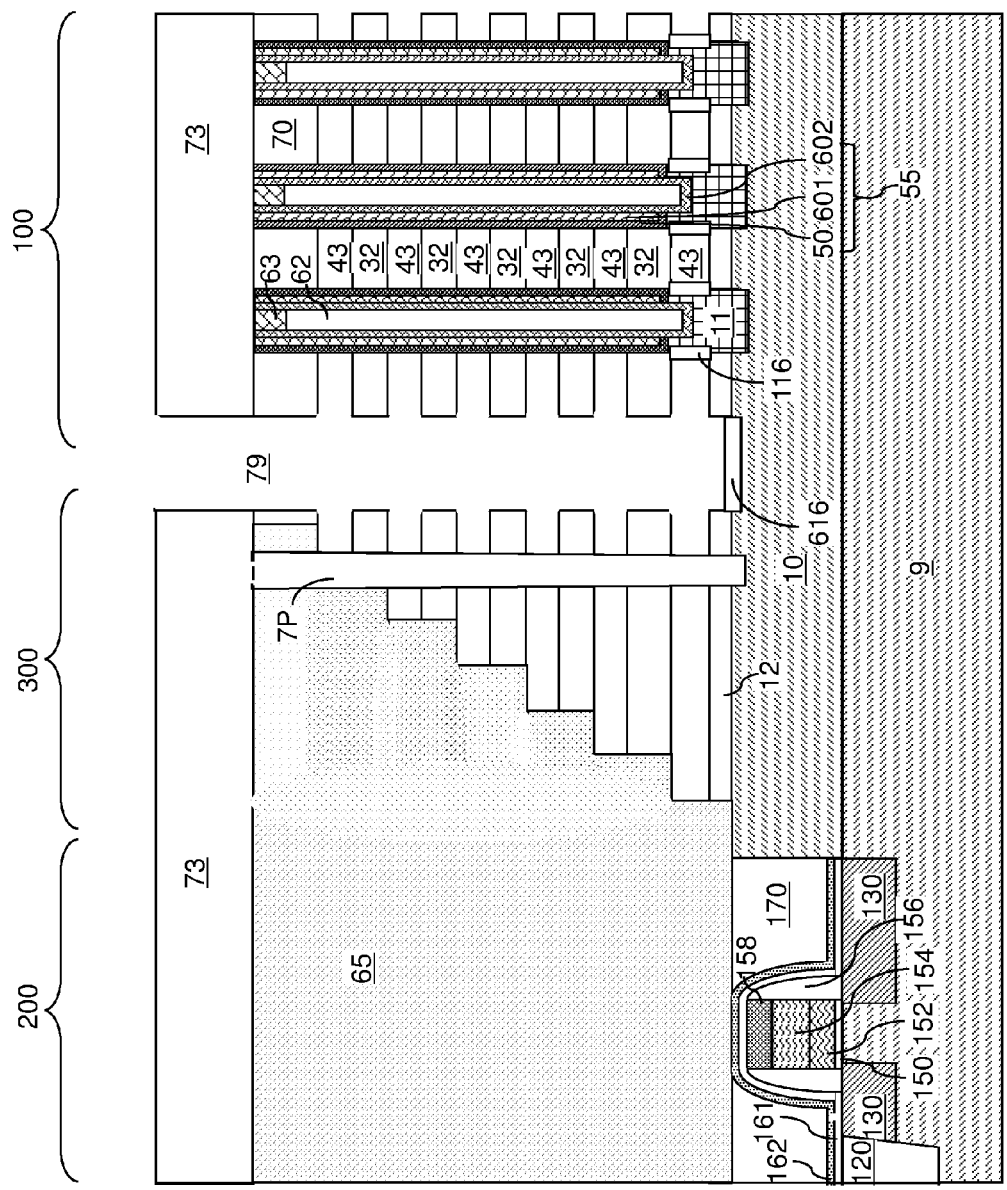
FIG. 8 is a schematic vertical cross-sectional view of the exemplary structure after formation of backside recesses according to an embodiment of the present disclosure.

Referring to FIG. 8, an etchant that selectively etches the second material of the sacrificial material layers 42 with respect to the first material of the insulating layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor material layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert each physically exposed surface portion of the semiconductor material layer 10 into surface dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each surface dielectric portion 616 includes a dielectric material that includes the same semiconductor element as the semiconductor material layer and additionally includes at least one non-metallic element such as oxygen and/or nitrogen such that the material of the surface dielectric portions 616 is a dielectric material. In one embodiment, the surface dielectric portions 616 can include a dielectric oxide, a dielectric nitride, or a dielectric oxynitride of the semiconductor material of the semiconductor material layer 10.

Figure 9:
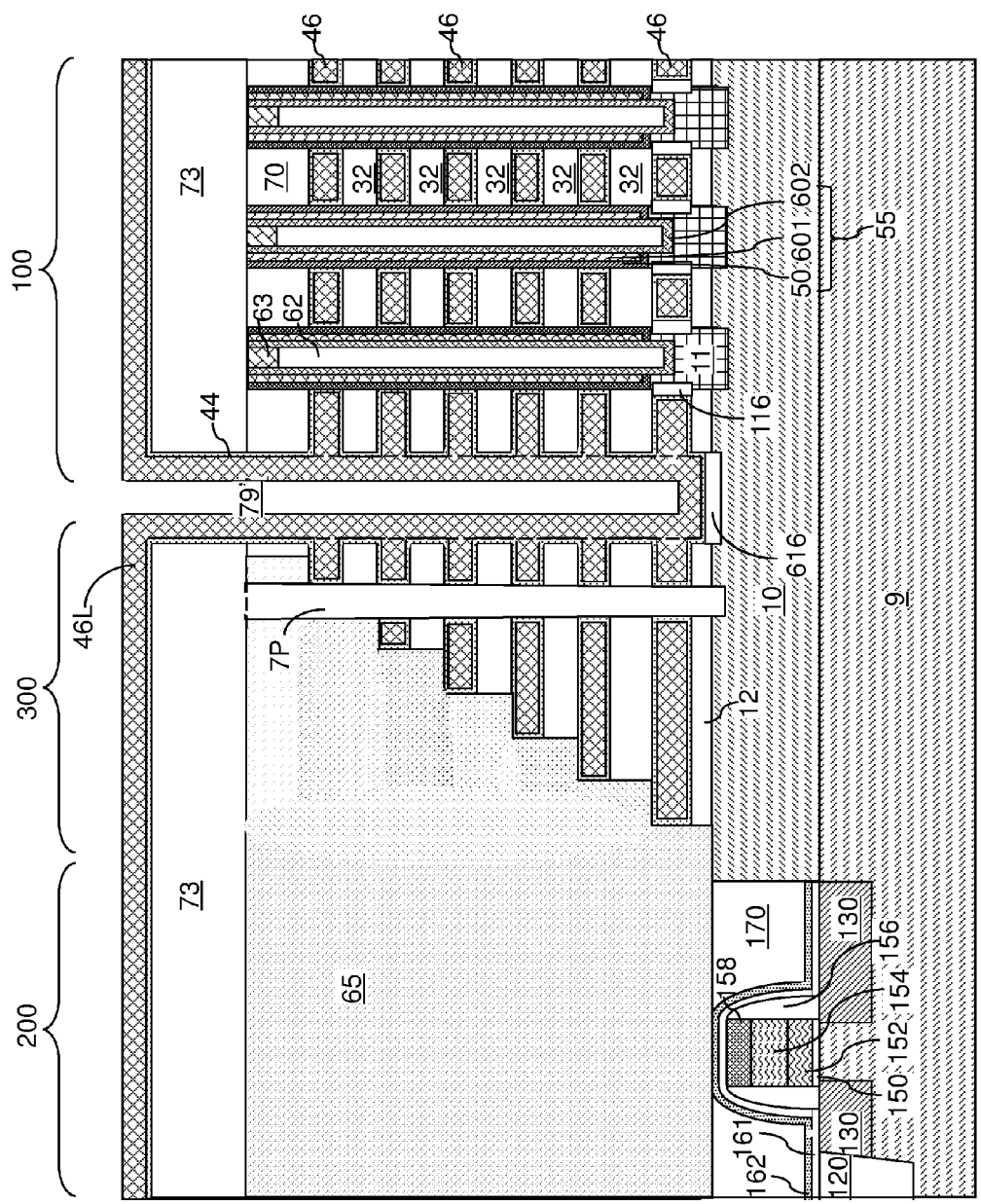
FIG. 9 is a schematic vertical cross-sectional view of the exemplary structure after formation of electrically conductive layers according to an embodiment of the present disclosure.

Referring to FIG. 9, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer (501, 503) is present within each memory opening, the backside blocking dielectric layer is optional. In case the blocking dielectric layer (501, 503) is omitted, the backside blocking dielectric layer is present.

The backside blocking dielectric layer 44 can be formed in the backside recesses 43 and on a sidewall of the backside contact trench 79. If the backside blocking dielectric layer 44 is formed, formation of the dielectric spacers 116 and the surface dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the at least one backside via trench 79, horizontal surfaces and sidewalls of the insulating layers 32, the portions of the sidewall surfaces of the memory stack structures 55 that are physically exposed to the backside recesses 43, and a top surface of the surface dielectric portion 616. A backside cavity 79' is present within the portion of each backside via trench 79 that is not filled with the backside blocking dielectric layer.

At least one metallic material can be deposited in the plurality of backside recesses 43, on the sidewalls of the at least one the backside contact trench 79, and over the top surface of the contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a continuous metallic material layer 46L can be formed on the sidewalls of each backside contact trench 79 and over the contact level dielectric layer 73. Thus, each sacrificial material layer 42 can be replaced with an electrically conductive layer 46. A backside cavity 79' is present in the portion of each backside contact trench 79 that is not filled with the backside blocking dielectric layer and the continuous metallic material layer 46L. A dielectric spacer 116 contacts, and laterally surrounds, a semiconductor portion, i.e., the epitaxial channel portion 11. One of the electrically conductive layers 46 laterally surrounds the dielectric spacer 116 upon formation of the electrically conductive layers 46.

Figure 10:
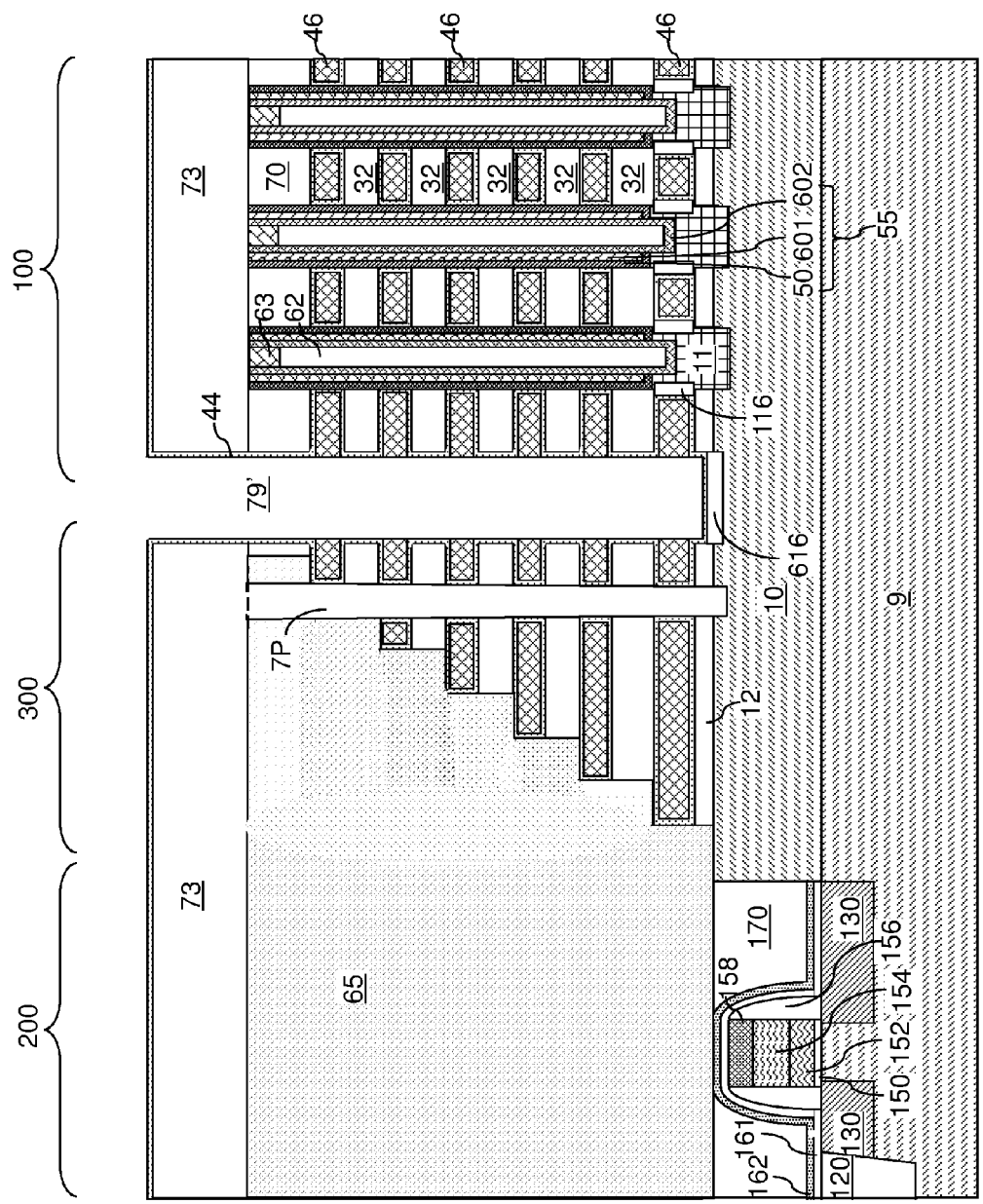
FIG. 10 is a schematic vertical cross-sectional view of the exemplary structure after removal of a deposited conductive material from within the backside contact trench according to an embodiment of the present disclosure.

Referring to FIG. 10, the deposited metallic material of the continuous electrically conductive material layer 46L is etched back from the sidewalls of each backside contact trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 11:
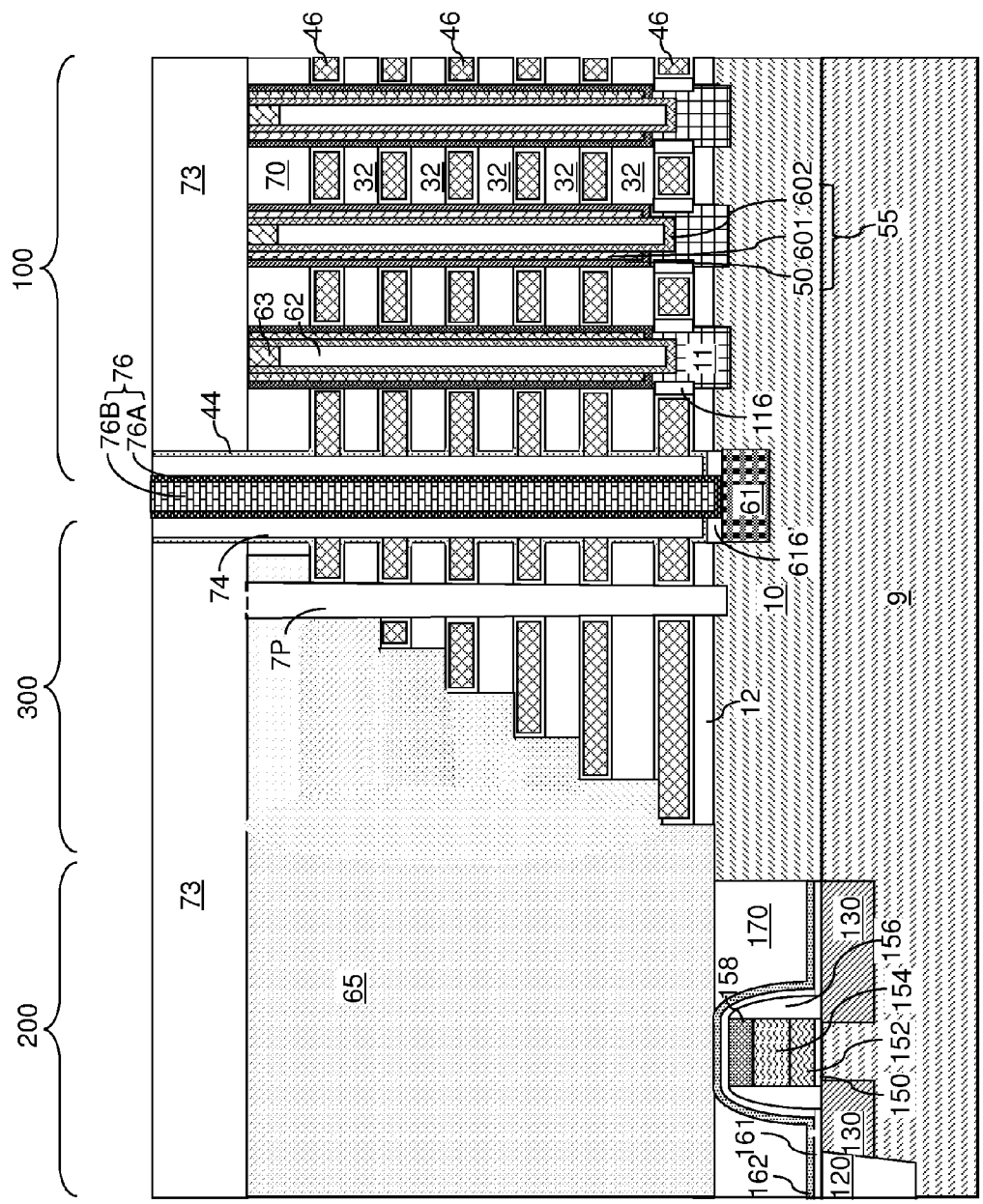
FIG. 11 is a schematic vertical cross-sectional view of the exemplary structure after formation of an insulating spacer and a backside contact via structure within each backside contact trench according to an embodiment of the present disclosure.

Referring to FIG. 11, an insulating material layer can be formed in the at least one backside contact trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the contact level dielectric layer 73 and at the bottom of each backside contact trench 79. Each remaining portion of the insulating material layer constitutes an insulating spacer 74. The insulating spacers 74 are formed at peripheral portions of the backside contact trenches 79.

A center portion of each surface dielectric portion 616 can be removed to form annular dielectric spacers 616', which includes an elongated opening that generally extend along the first horizontal direction hd1 and including wiggles along the second horizontal direction hd2. As used herein, an "annular" element refers to an element that is topologically homeomorphic to a torus, i.e., an element that can be continuously stretched without forming an additional hole or eliminating the preexisting hole into a torus.

A source region 61 can be formed at the bottom of each cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can contact a bottom surface of the insulating spacer 74. Each source region 61 can be located within the substrate 10, comprise a doped semiconductor material, overlap in area with the backside contact via structures 76 in a plan view along a vertical direction, and be electrically shorted to the backside contact via structures 76.

A backside contact via structure 76 can be formed within each cavity 79' by filling the remaining volumes of the backside contact trenches 79 with at least one conductive material. Each backside contact via structure 76 can fill a respective cavity 79'. The backside contact via structures 76 can be formed by depositing at least one conductive material in the remaining unfilled volume (i.e., the backside cavity 79') of the backside contact trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside contact trenches 79 constitutes a backside contact via structure 76. Each backside contact via structure 76 can be formed directly on a top surface of a source region 61.

Figure 12:
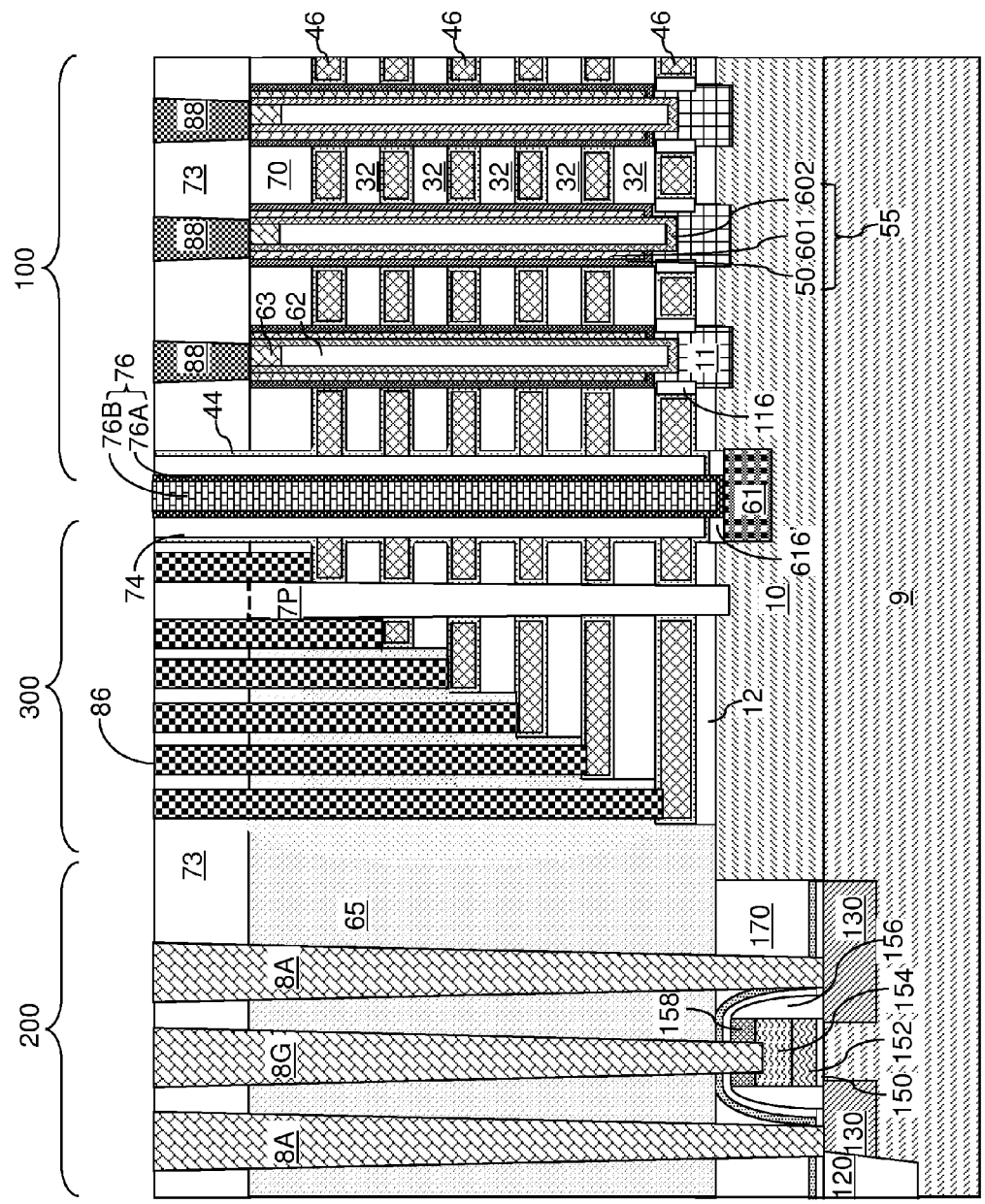
FIG. 12 is a schematic vertical cross-sectional view of the exemplary structure after formation of additional contact via structures according to an embodiment of the present disclosure.

Referring to FIG. 12, additional contact via structures (88, 86, 8A, 8G) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral gate contact via structures 8G and peripheral active region contact via structures 8A can be formed through the retro-stepped dielectric material portion 65 directly on respective nodes of the peripheral devices.

Figure 13A:
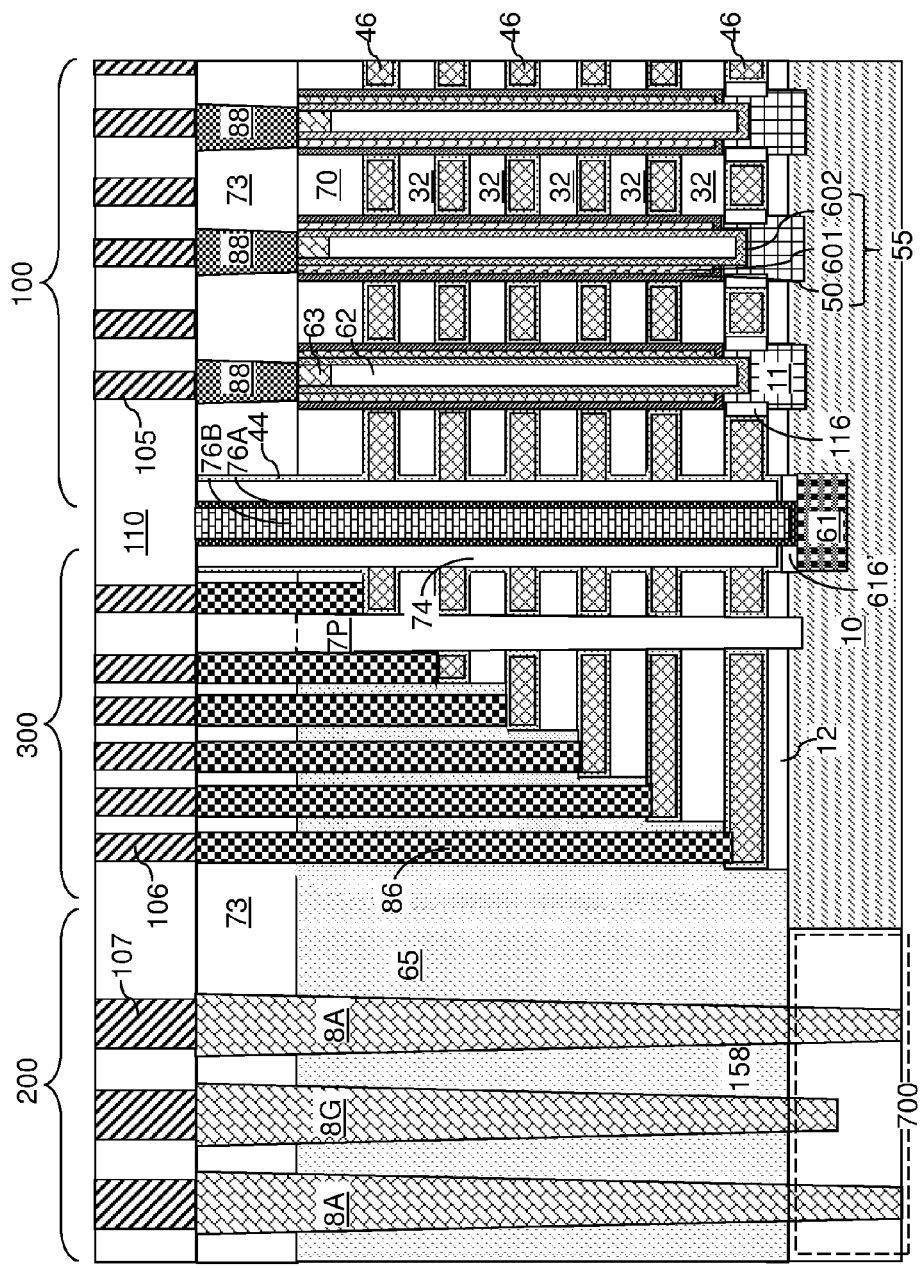
FIG. 13A is a first schematic vertical cross-sectional view of the exemplary structure after formation of bit lines and source shunt lines according to an embodiment of the present disclosure.
Figure 13B:
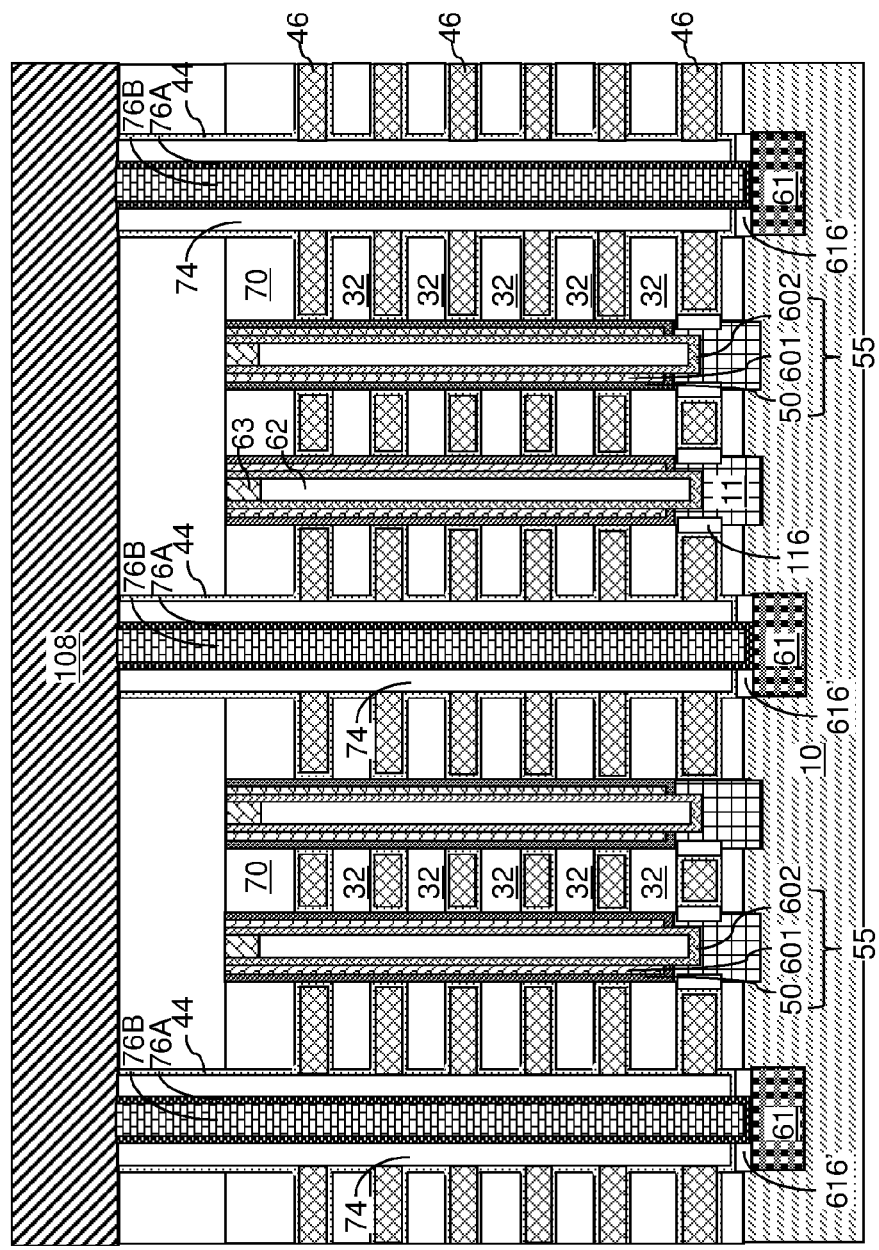
FIG. 13B is a second schematic vertical cross-sectional view of the exemplary structure after formation of bit lines and source shunt lines according to an embodiment of the present disclosure.

Referring to FIGS. 13A and 13B, a line level dielectric layer 110 can be formed over the contact level dielectric layer 73. The line level dielectric layer 110 can have a uniform thickness throughout, and can be formed by a conformal or a non-conformal deposition process. The line level dielectric layer 110 includes a dielectric material such as silicon oxide, silicon nitride, organosilicate glass, a dielectric metal oxide, or a combination thereof.

Line cavities can be formed through the line level dielectric layer 110, and can be filled to form various metal lines. The metal lines are embedded in the line level dielectric layer 110, and can include bit lines 105 that contact drain contact via structures 88, word line interconnection line structures 106 contacting the word line contact via structures 86, peripheral interconnection line structures 107 contacting the peripheral gate contact via structures 8G or the peripheral active region contact via structures 8A. Further, the metal lines can include source shunt lines 108 that contact portions of the backside contact via structures 76. The bit lines 105 and the source shunt lines 108 can extend parallel to one another along a same direction, which may be the second horizontal direction hd2.

The bit lines 105 provide access to each of the drain regions 63. Each bit line 105 can be electrically shorted only one drain region 63 per string (i.e., per memory block which comprises the set of memory stack structures 55 between a neighboring pair of backside contact via structures 76). Alternatively, trench isolation structures (not shown) providing electrical isolation between drain select gate electrodes (a subset of the electrically conductive layers 46 employed to select an activated semiconductor channel 60) can be employed, and each bit line 105 can be electrically shorted to more than one drain region per string (i.e., per memory sub-block). A trench isolation structure comprises an insulating material which entirely fills a shallow trench which extends only through drain select gate electrodes (i.e., the top one or more electrically conductive layers 46 which function as drain select electrodes). As described above, a string corresponds to a memory block if the string is located between two backside trenches 79 which extend through the entire alternating stack (32, 46) and which are filled with a backside contact via structure 76. A sting corresponds to a sub-block of a memory block if the string is located between a trench isolation structure in a shallow trench and either another trench isolation structure or a backside trench 79 described above.

Figure 14A:
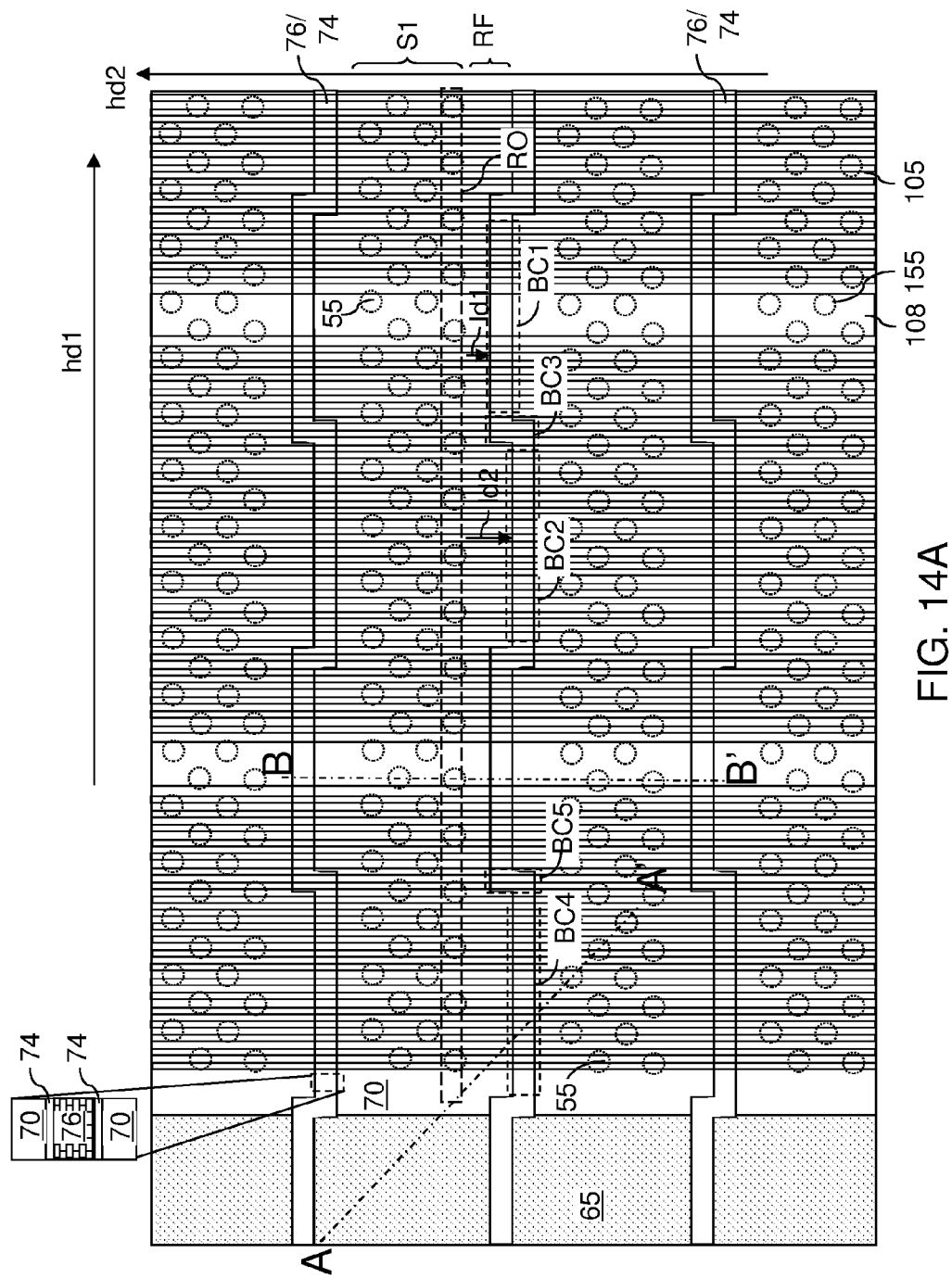
FIG. 14A is a see-through top-down view of the exemplary structure of FIGS. 13A and 13B for the case of a first exemplary geometry for the backside contact trenches according to an embodiment of the present disclosure. The vertical plane A-A' corresponds to the plane of the schematic vertical cross-sectional view of FIG. 13A. The vertical plane B-B' corresponds to the plane of the schematic vertical cross-sectional view of FIG. 13B.
Figure 14B:
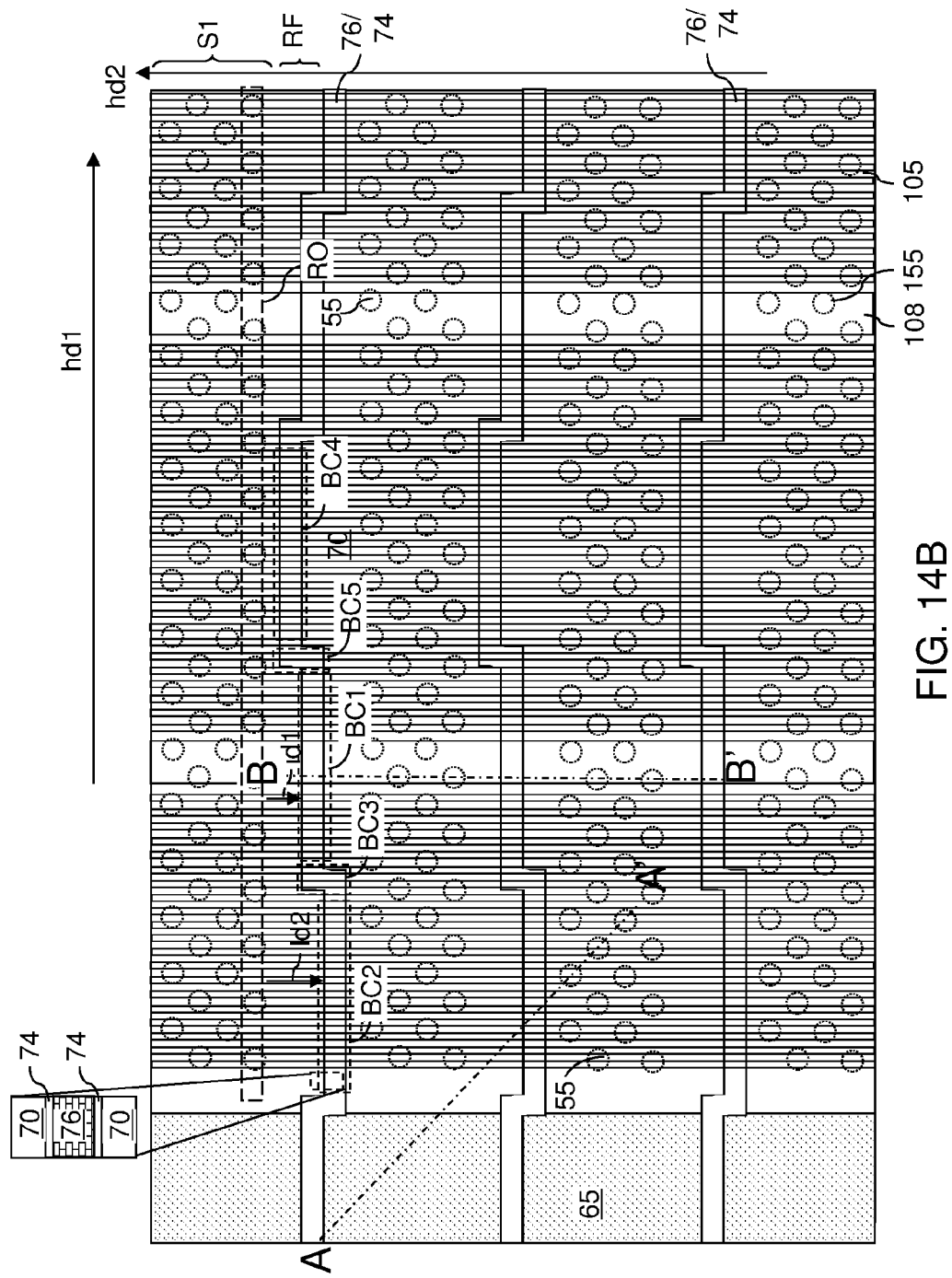
FIG. 14B is a see-through top-down view of the exemplary structure of FIGS. 13A and 13B for the case of a second exemplary geometry for the backside contact trenches according to an embodiment of the present disclosure. The vertical plane A-A' corresponds to the plane of the schematic vertical cross-sectional view of FIG. 13A. The vertical plane B-B' corresponds to the plane of the schematic vertical cross-sectional view of FIG. 13B.
Figure 14C:
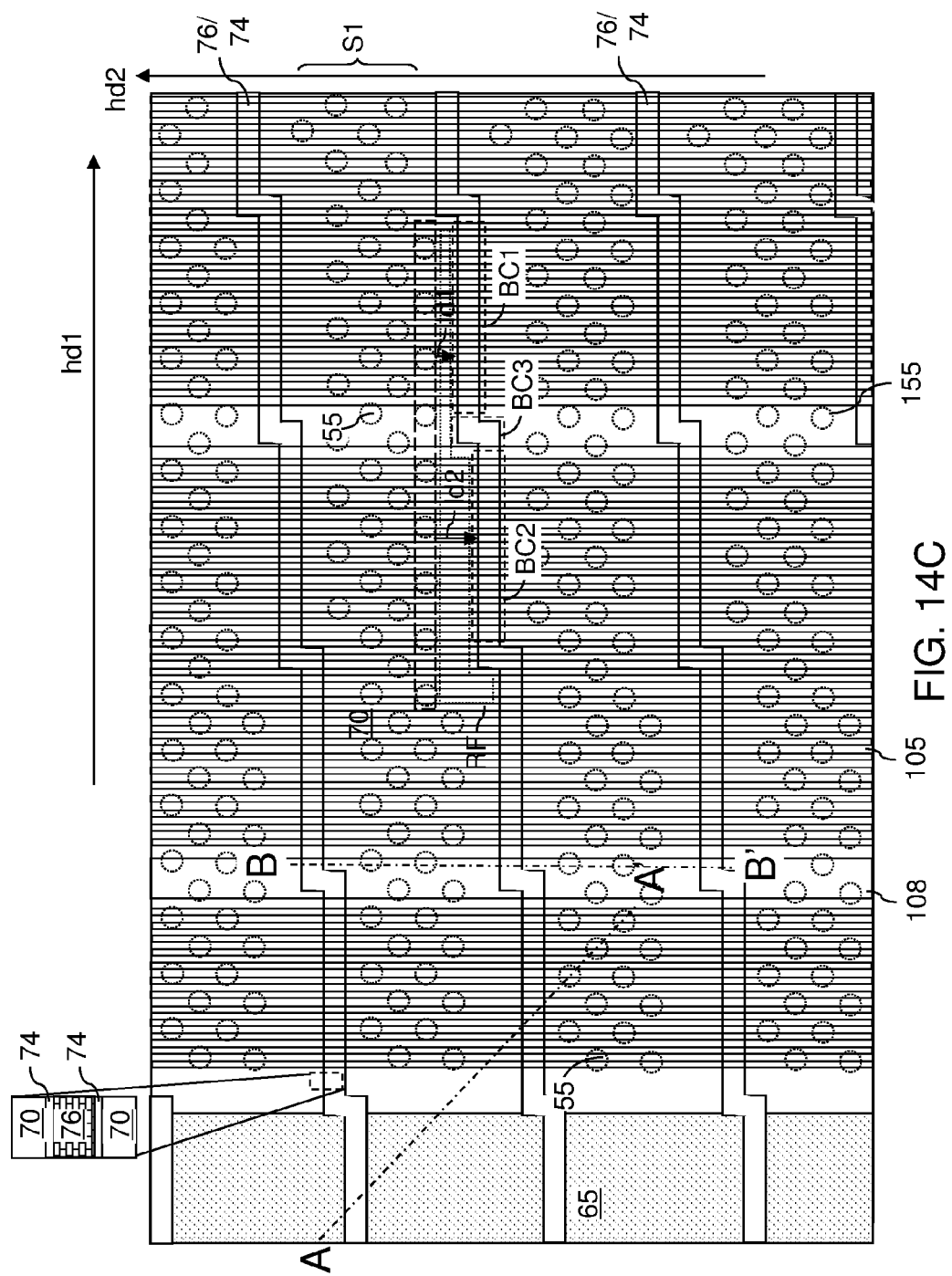
FIG. 14C is a see-through top-down view of the exemplary structure of FIGS. 13A and 13B for the case of a third exemplary geometry for the backside contact trenches according to an embodiment of the present disclosure. The vertical plane A-A' corresponds to the plane of the schematic vertical cross-sectional view of FIG. 13A. The vertical plane B-B' corresponds to the plane of the schematic vertical cross-sectional view of FIG. 13B.
Figure 14D:
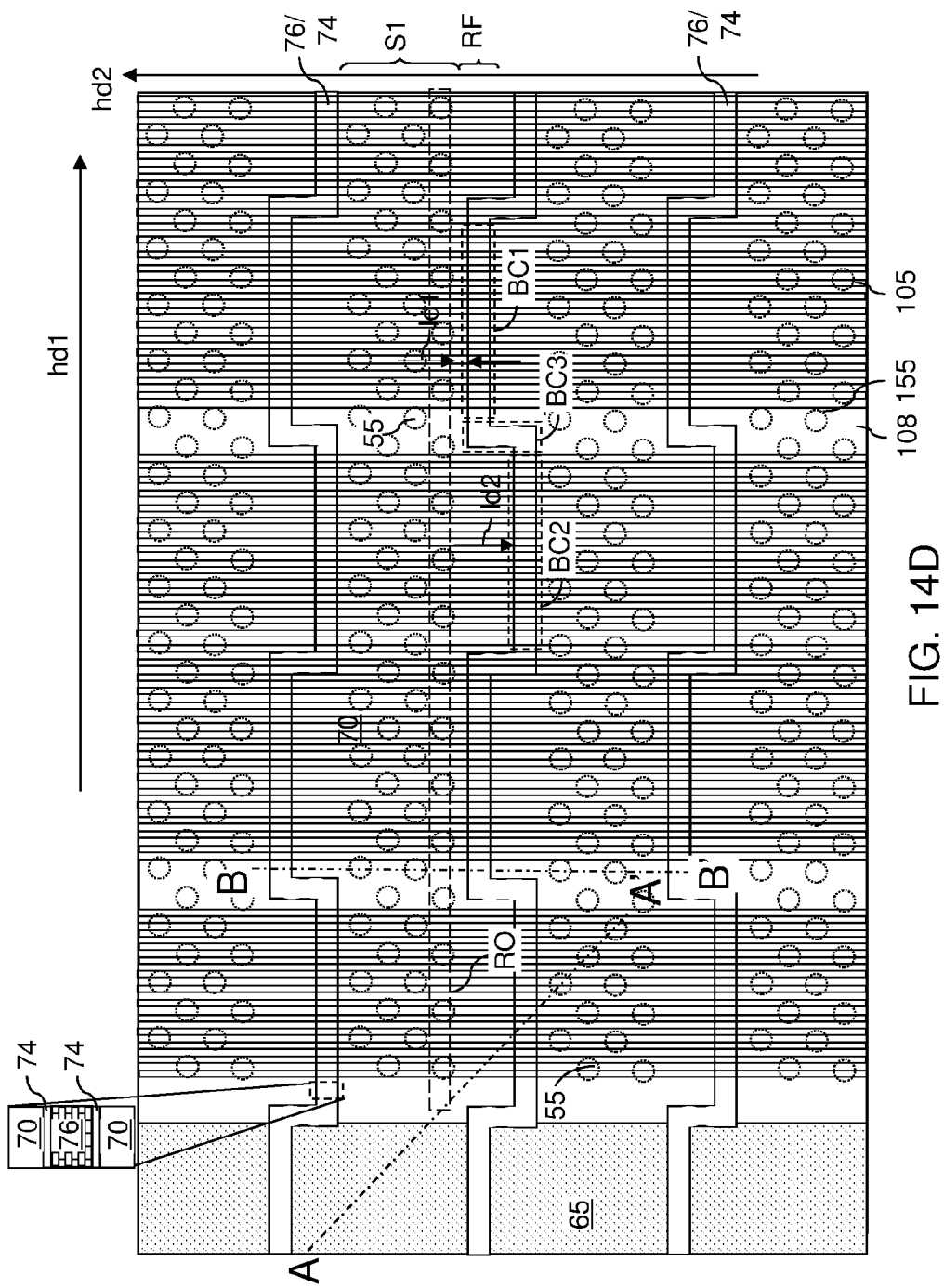
FIG. 14D is a see-through top-down view of the exemplary structure of FIGS. 13A and 13B for the case of a fourth exemplary geometry for the backside contact trenches according to an embodiment of the present disclosure. The vertical plane A-A' corresponds to the plane of the schematic vertical cross-sectional view of FIG. 13A. The vertical plane B-B' corresponds to the plane of the schematic vertical cross-sectional view of FIG. 13B.

The source shunt lines 108 electrically shorts the backside contact via structures 76 together to provide the same voltage to each source region 61. The source shunt lines 108 prevents significant voltage variations across various portions of the source regions 61 by providing low resistance conductive paths to each portion of the source regions 61. As shown in FIG. 13B, the source shunt lines 108 extend above dummy memory stack structures 155. Dummy memory stack structures 155 lack a drain side electrical connection. In other words, the dummy memory stack structures 155 may be identical to the memory stack structures 55 except that their drain regions 63 are not electrically connected to a bit line 105 (e.g., drain contact via structures 88 may be omitted above the dummy memory stack structures 155). Alternatively, the dummy memory stack structures 155 may include the vertical channel 60 and the memory film 50 but may lack a drain region 63. Alternatively, no type of memory stack structures (55, 155) may be located below the source shunt lines 108, as shown in FIG. 14F.

FIGS. 14A, 14B, 14C, 14D, 14E, and 14F illustrate first, second, third, fourth, fifth, and sixth exemplary geometries for the backside contact via structures 76, the bit lines 105, and the source shunt lines 108 according to various embodiments of the present disclosure. The exemplary geometries expressly described herein are not intended to be an exhaustive list of geometries for the backside contact via structures 76, the bit lines 105, and the source shunt lines 108 for implementation of the present disclosure, but are merely intended as illustrative examples for describing the guiding principles for implementing the present disclosure. As such, numerous variations of the disclosed geometries can be implemented without deviating from the spirit of the present disclosure.

The various structures illustrated in FIGS. 13A, 13B, and 14A-14F illustrate a three-dimensional memory device. The three-dimensional memory device can include an alternating stack of insulating layers 32 and electrically conductive layers 46 located over a substrate (9, 10), strings of memory stack structures 55, and backside contact via structures 76. Each of the memory stack structures 55 extends through the alternating stack (32, 46) and comprises a vertical stack of memory elements (e.g., charge storage regions, as embodied as a charge storage layer 504), a tunneling dielectric 506, and a vertical semiconductor channel 60. The backside contact via structures 76 vertically extend through the alternating stack (32, 46) generally along a first horizontal direction hd1, and laterally separate neighboring pairs of strings of memory stack structures 55 along a second horizontal direction hd2 that is perpendicular to the first horizontal direction hd1. Each of the backside contact via structures 76 includes multiple laterally extending portions (BC1, BC2) that extend along the first horizontal direction hd1 and laterally offset along the second horizontal direction hd2 and adjoined by adjoining portions BC3 that laterally extend along a direction different from the first direction hd1.

In some embodiments, the three-dimensional memory device can further include bit lines 105 that are electrically connected to respective vertical semiconductor channels 60 in a predominant subset of the memory stack structures 55 (such as all memory stack structures 55 except for a subset of the dummy memory stack structures 155 that underlie the source shunt lines 108 and that are not electrically connected to any bit line 105) through a respective drain region 63. The bit lines 105 laterally extend along the second horizontal direction hd2.

The three-dimensional memory device can further include source shunt lines 108 that are electrically connected (e.g., shorted) to the backside contact via structures 76. The source shunt lines 108 overly a subset of dummy memory stack structures 155 where each dummy memory stack structure 155 does not electrically contact one of the bit lines 105. The source shunt lines 108 laterally extend along the second horizontal direction hd2.

Each of the backside contact via structures 76 comprises multiple laterally extending portions (e.g., BC1, BC2, BC4) that extend along the first horizontal direction hd1. A first subset of the laterally extending portions (e.g., BC1) is located at least partially under the source shunt lines 108, and is laterally offset along the second horizontal direction hd2 from a second subset laterally extending portions (e.g., BC2, BC4) which are located under the bit lines 105 as illustrated in FIGS. 14A and 14B. Each of the backside contact via structures 76 further comprises adjoining portions (e.g., BC3, BC5) that laterally extend along a direction different from the first direction hd1 (e.g., in the second direction hd2 or at an angle between the first and second directions). The adjoining portions connect a laterally extending portion of the first subset (e.g., BC1) to an adjacent laterally extending portion (e.g., BC2) of the second subset.

In some embodiments, a first string S1 among the strings of memory stack structures 55 includes an outermost row RO of memory stack structures 55 located along a substantially straight line extending parallel to the first horizontal direction hd1. A region RF free of memory stack structures 55 is provided between the outermost row RO of memory stack structures 55 and a backside contact via structure 76 among the backside contact via structures 76 that is most proximal to the first string S1.

In some embodiments, each of the backside contact via structure 76 can include a first backside contact via structure portion BC1 that is spaced from the outermost row RO of memory stack structures 55 by a first distance ld1 along the second horizontal direction hd2, and a second backside contact via structure portion BC2 that is spaced from the outermost row RO of memory stack structures 55 by a second distance ld2 different from the first distance ld1 along the second horizontal direction hd2.

In some embodiments shown in FIGS. 14A, 14B, 14D and 14E, the outermost row RO of memory stack structures 55 comprises a substantially straight line which extends from one end of the string to the opposite end of the string (i.e., from one end of the backside contact via structure 76 to the opposite end of the backside contact via structure 76 in the memory array region 100). A substantially straight line is a line which is exactly straight or which includes unavoidable deviations from the exactly straight line due to lithography variations used to pattern the memory openings 49 in which the memory stack structures 55 are located. In this case, the region RF free of memory stack structures 55 has a first width ld1 adjacent to portion BC1 of the backside contact via structure 76 and a greater width ld2 adjacent to portion BC2 of the same backside contact via structure 76. In other words, the distance between the side of the backside contact via structure 76 and the nearest (i.e., outer) memory stack structure row RO varies along the length of the backside contact via structure 76.

In some embodiments, a first subset of at least two memory stack structures 55 within the outermost row RO of memory stack structures 55 is laterally spaced from the first backside contact via structure portion BC1 by the first distance ld1, and a second subset of at least two other memory stack structures 55 within the outermost row RO of memory stack structures 55 is laterally spaced from the second backside contact via structure portion BC2 by the second distance ld2.

In some embodiments, as illustrated in FIGS. 14A-14D, the first backside contact via structure portion BC1 and the second backside contact via structure portion BC2 are adjoined to each other by a third backside contact via structure portion BC3 that laterally extends along the second horizontal direction hd2 by a distance greater than a width of the first backside contact via structure portion BC1.

Figure 14E:
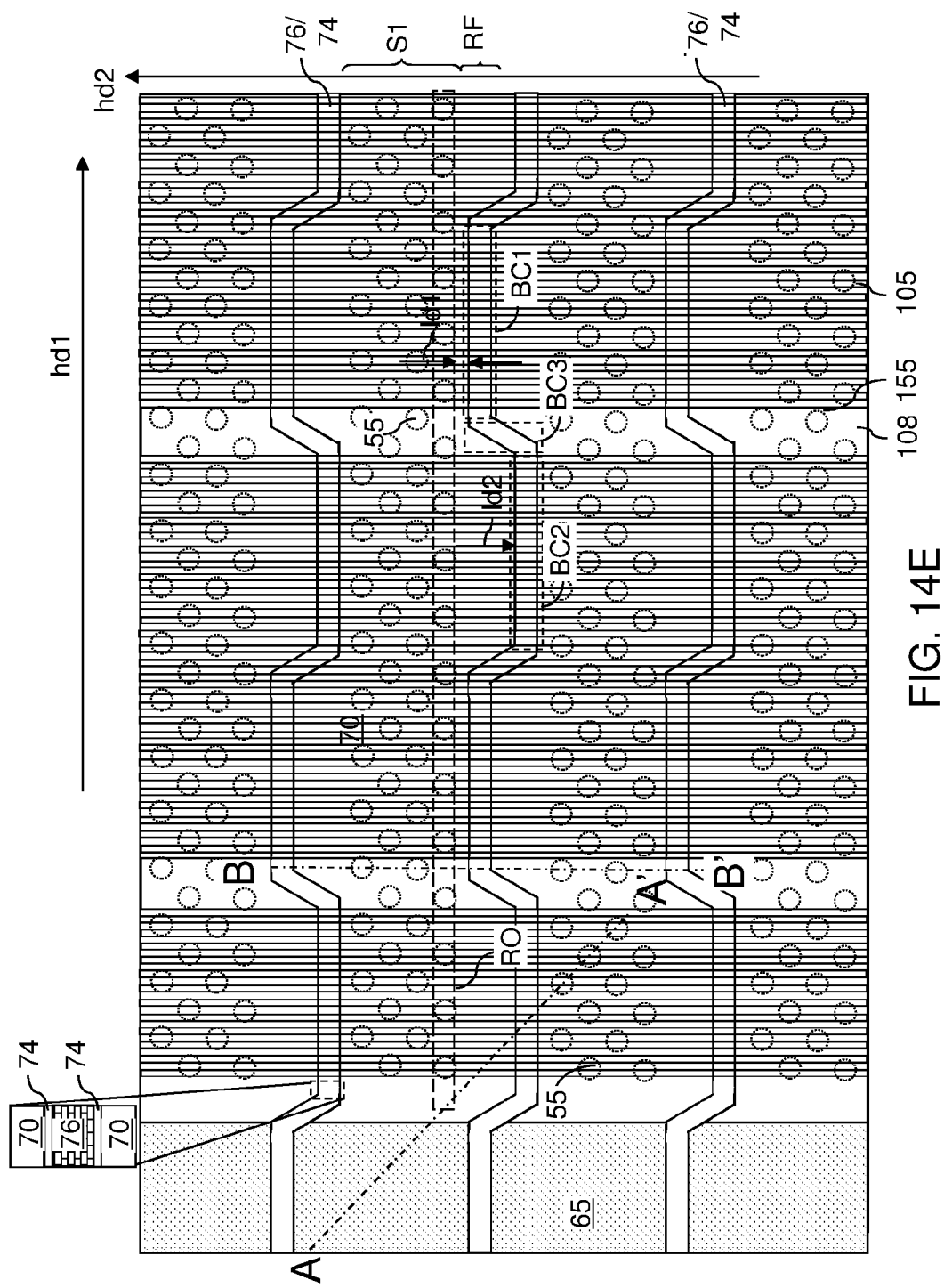
FIG. 14E is a see-through top-down view of the exemplary structure of FIGS. 13A and 13B for the case of a fifth exemplary geometry for the backside contact trenches according to an embodiment of the present disclosure. The vertical plane A-A' corresponds to the plane of the schematic vertical cross-sectional view of FIG. 13A. The vertical plane B-B' corresponds to the plane of the schematic vertical cross-sectional view of FIG. 13B.
Figure 14F:
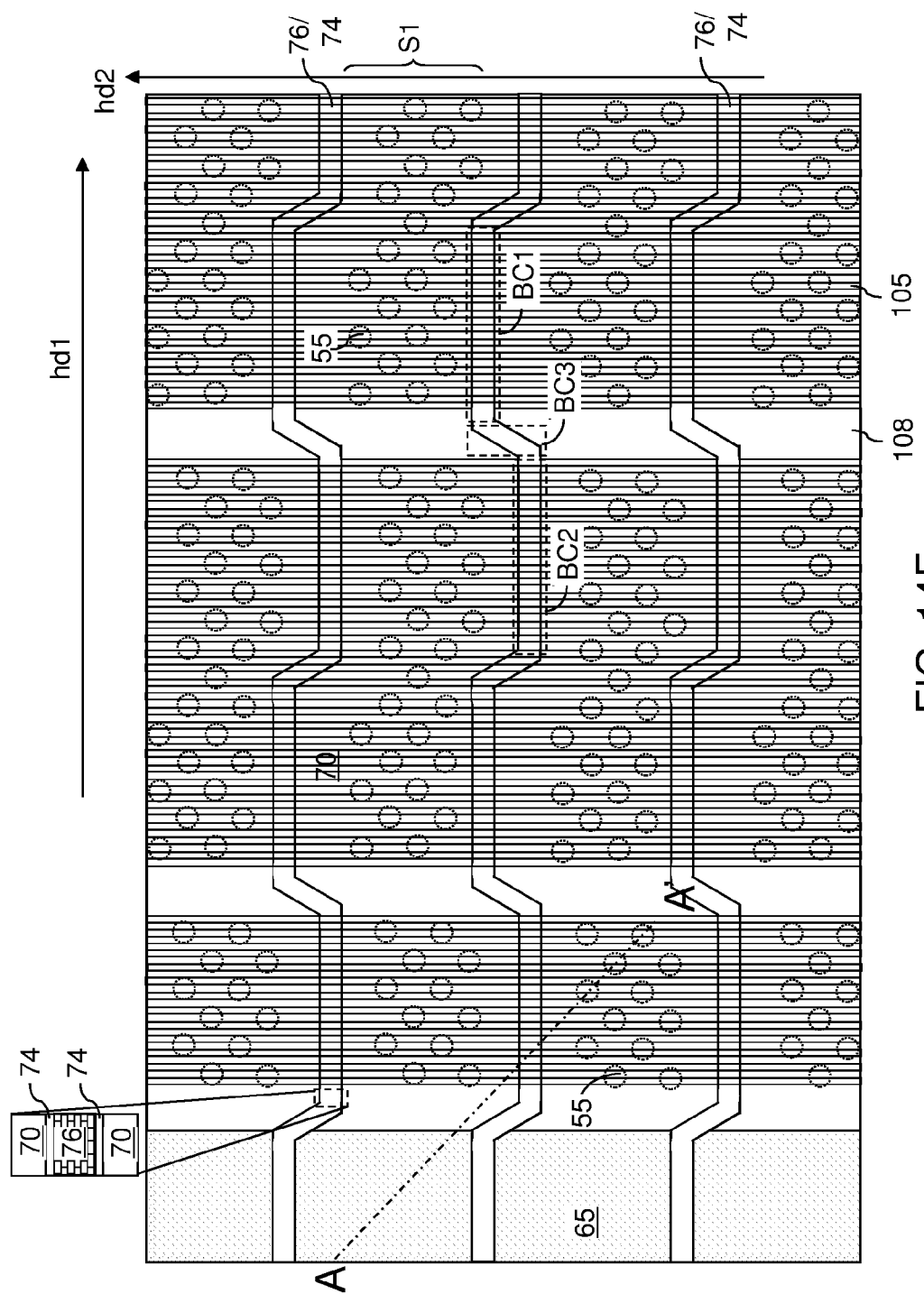
FIG. 14F is a see-through top-down view of the exemplary structure of FIGS. 13A and 13B for the case of a sixth exemplary geometry for the backside contact trenches according to an embodiment of the present disclosure. The vertical plane A-A' corresponds to the plane of the schematic vertical cross-sectional view of FIG. 13A. The vertical plane B-B' corresponds to the plane of the schematic vertical cross-sectional view of FIG. 13B.

In some embodiments, as illustrated in FIGS. 14E and 14F, the first backside contact via structure portion BC1 and the second backside contact via structure portion BC2 are adjoined to each other by a third backside contact via structure portion BC3 that laterally extends along a horizontal direction between the first horizontal direction hd1 and the second horizontal direction hd2 by a distance greater than a width of the first backside contact via structure portion BC1. In some embodiment, each of the backside contact via structures 76 can have the same configuration as the backside contact via structure 76 that is most proximal to the first string S1. In some embodiments, the backside contact via structures 76 can form a periodic one-dimensional array that is repeated with periodicity along the second horizontal direction hd2.

In some embodiments shown in FIGS. 14B and 14C, the backside contact via structure 76 that is most proximal to the first string S1 includes at least three (such as four or more) laterally extending portions that extend along the first horizontal direction hd1 and at least two (such as three or more) adjoining portions that connect a neighboring pair of laterally extending portions. In other words, as shown in FIG. 14B, at least two portions (e.g., BC1 and BC2) which extend in the first horizontal direction hd1 and which are connected to each other by portion (e.g., BC3) which does not extend in the first horizontal direction are offset in the same horizontal direction (e.g., in the direction of arrows ld1 and ld2) from a third portion (e.g., BC4) which extends in the first horizontal direction hd1 and which is connected to the at least two portions (e.g., BC1 and BC2) by another portion (e.g., BC5) which does not extend in the first horizontal direction. In the embodiment of FIG. 14C the entire backside contact via structure 76 that is most proximal to the first string S1 generally extends at an oblique angle relative to the first horizontal direction hd1.

In some embodiments, each of the backside contact via structures 76 can have the same configuration as the backside contact via structure 76 that is most proximal to the first string S1. In some embodiments, the backside contact via structures 76 can form a periodic one-dimensional array that is repeated with periodicity along the second horizontal direction hd2. In some embodiments, the backside contact via structure 76 that is most proximal to the first string S1 includes at least three (such as four or more) laterally extending portions that extend along the first horizontal direction hd1 and at least two (such as two or more) adjoining portions that connect a neighboring pair of laterally extending portions such that the backside contact via structure 76 that is most proximal to the first string S1 generally extends along the first horizontal direction hd1 with periodic lateral deviations along the second horizontal direction hd2. In some embodiment, each of the backside contact via structures 76 can have the same configuration as the backside contact via structure 76 that is most proximal to the first string S1. In some embodiments, the backside contact via structures 76 can form a periodic one-dimensional array that is repeated with periodicity along the second horizontal direction hd2.

Source regions 61 can be located within the substrate (9, 10). The source regions 61 can include a doped semiconductor material, overlap in area with the backside contact via structures 76 in a plan view along a vertical direction, and be electrically connected shorted to the backside contact via structures 76.

In some embodiment, the source shunt lines 108 can contact a respective top surface of a first subset of laterally extending portions (i.e., the laterally extending portions that overlap with the source shunt lines 108 in a plan view) of the backside contact via structures 76 while not contacting a second subset of laterally extending portions (i.e., the laterally extending portions that do not overlap with the source shunt lines 108 in a plan view) of the backside contact via structures 76. In some embodiments, each neighboring pair of laterally extending portions within the first subset and included in a same backside contact via structure 76 can be laterally spaced from one another by at least one laterally extending portion within the second subset. In some embodiment, the source shunt lines 108 can contact every n-th laterally extending portion within each backside contact via structure 76, in which n is an integer greater than 1.

In some embodiments, each of the electrically conductive layers 46 comprises word line strips that laterally extend generally along the first horizontal direction hd1 and laterally confined along the second horizontal direction hd2 by a pair of trenches (i.e., backside contact trenches 79) including a pair of backside contact via structures 76. In some embodiments, stepped terraces can be patterned from the electrically conductive layers 46. In this case, each underlying electrically conductive layer 46 within the alternating stack (32, 46) extends farther along the first horizontal direction hd1 than any overlying electrically conductive layer 46 within the alternating stack (32, 46). Each of the plurality of electrically conductive layers 46 (i.e., word lines/control gate electrodes) has a nonlinear side wall adjacent to the at least one backside contact trench 79 containing the backside contact via structures 76 in the memory device region 100. In other words, the sidewalls of layers 46 "wiggle" or shift with the shifts in the offset portions (e.g., TR1, TR2) of the trenches 79 containing the offset portions (e.g., BC1, BC2) of the structures 76.

In one embodiment, each of the memory stack structures 55 comprises, from outside to inside, a vertical stack of memory elements (as embodied, for example, as portions of the memory material layer 504 located at the levels of the electrically conductive layers 46), a tunneling dielectric 506, and a vertical semiconductor channel 60, and the electrically conductive layers 46 can comprise word lines for the vertical stack of memory elements 55.

In some embodiments, the three-dimensional memory device comprises a vertical NAND device located over the substrate (9, 10); the electrically conductive layers 46 comprise, or are electrically connected to, a respective word line of the NAND device; the substrate (9, 10) comprises a silicon substrate; the vertical NAND device comprises an array of monolithic three-dimensional NAND strings over the silicon substrate; at least one memory cell in a first device level of the array of monolithic three-dimensional NAND strings is located over another memory cell in a second device level of the array of monolithic three-dimensional NAND strings; and the silicon substrate contains an integrated circuit comprising a driver circuit for the memory device located thereon. The array of monolithic three-dimensional NAND strings can comprise: a plurality of semiconductor channels (60, 11, and a surface portion of the semiconductor material layer between the source region 61 and the epitaxial channel portions 11), wherein at least one end portion of each of the plurality of semiconductor channels extends substantially perpendicular to a top surface of the substrate (9, 10); a plurality of charge storage elements, each charge storage element located adjacent to a respective one of the plurality of semiconductor channels; and a plurality of control gate electrodes having a strip shape extending substantially parallel to the top surface of the substrate (9, 10), (for example, along the first horizontal direction), the plurality of control gate electrodes comprise at least a first control gate electrode located in the first device level and a second control gate electrode located in the second device level.

The various exemplary structures of the present disclosure provide greater structural stability against collapse of the backside contact via structures 76 during manufacturing and/or operation of the semiconductor device employing the wiggles formed by lateral shifts of various portions of the backside contact via structures along the second horizontal direction that is perpendicular to the first horizontal direction. As such, mechanical stability of three-dimensional semiconductor devices can be enhanced through the features of the structures of the present disclosure.

The various exemplary structures of the present disclosure can be employed to reduce or prevent die (e.g., substrate) cracking that tends to occur along the lengthwise direction of backside contact via structures in prior art devices. It is believed that the crack is a result of the stress accumulated on the die by depositing multiple tungsten layers, while the substrate serves as a sustaining platform to counter the stress. When the substrate is thinned, the accumulated stress is no longer suppressed by the substrate, and can be released by cracking the die along the lengthwise direction of backside contact via structures in the prior art structures. The wiggles in the backside contact via structures of the present disclosure suppress die cracking induced by such mechanisms.

Furthermore, by making the offsets or wiggles under the source shunt lines 108 which overly dummy memory stack structures 155 avoids variation in location of memory stack structures 55 and their respective connections to the bit lines 105. This simplifies the connection process and geometry. Furthermore, by forming the memory stack structures 55 in a substantially straight outermost row RO also simplifies the connection process and geometry. Finally, by having two or more consecutive offset portions of the structure 76 in the same direction further decreases the amount of stress placed on the substrate and may lead to a further reduction in die cracking.

According to another aspect of the present disclosure, suppression of die cracking can be further effected by providing multiple planes in which sets of backside contact via structures 76 are laterally offset along the direction perpendicular to the lengthwise direction of the backside contact via structures 76 by a finite distance (such as one half the pitch of the backside contact via structures 76) along the direction perpendicular to the lengthwise direction of the backside contact via structures.

Figure 15:
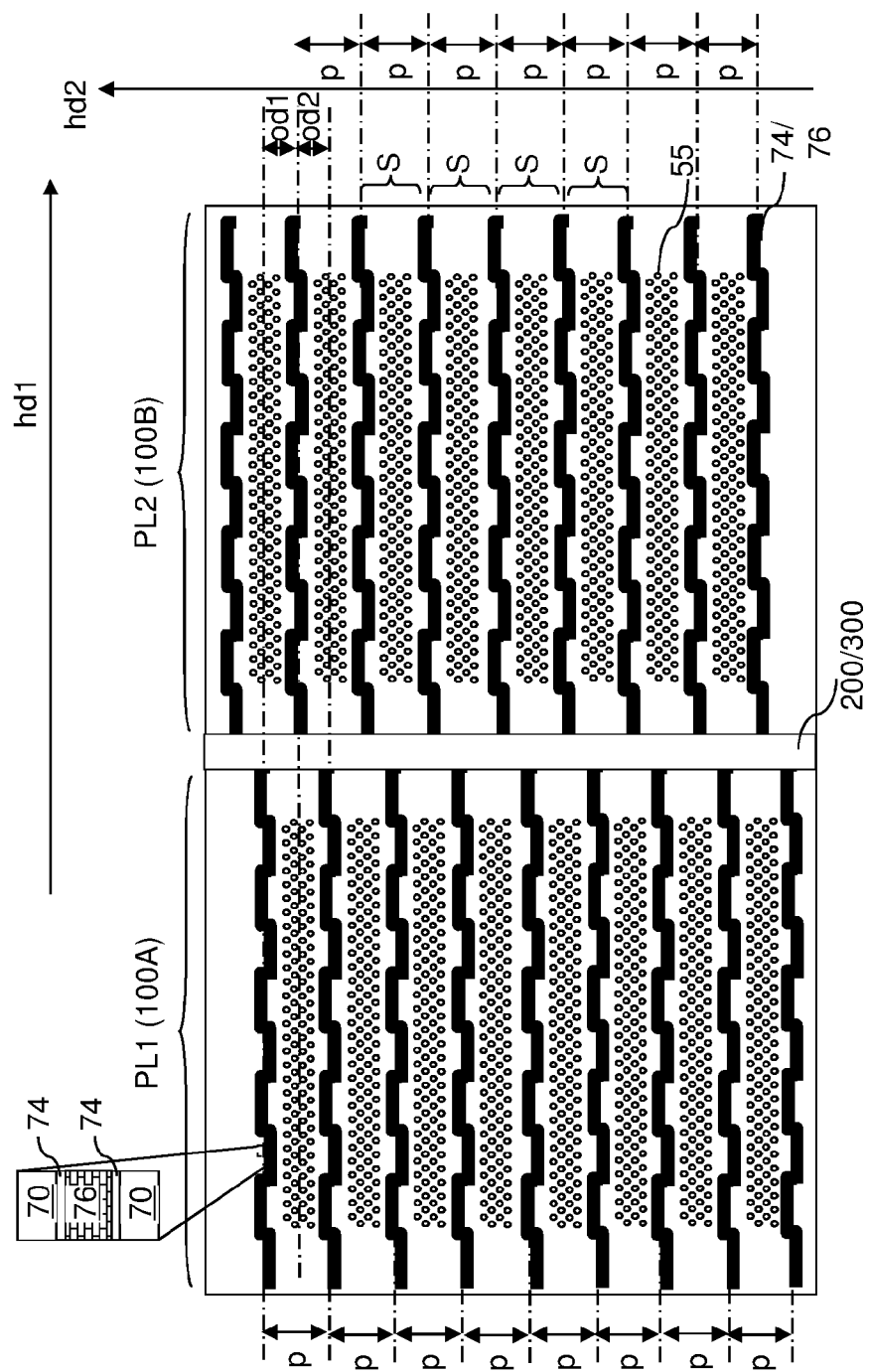
FIG. 15 is a first exemplary structure including a three-dimensional memory device in which backside contact via structures are laterally offset between neighboring planes according to an aspect of the present disclosure.
Figure 16:
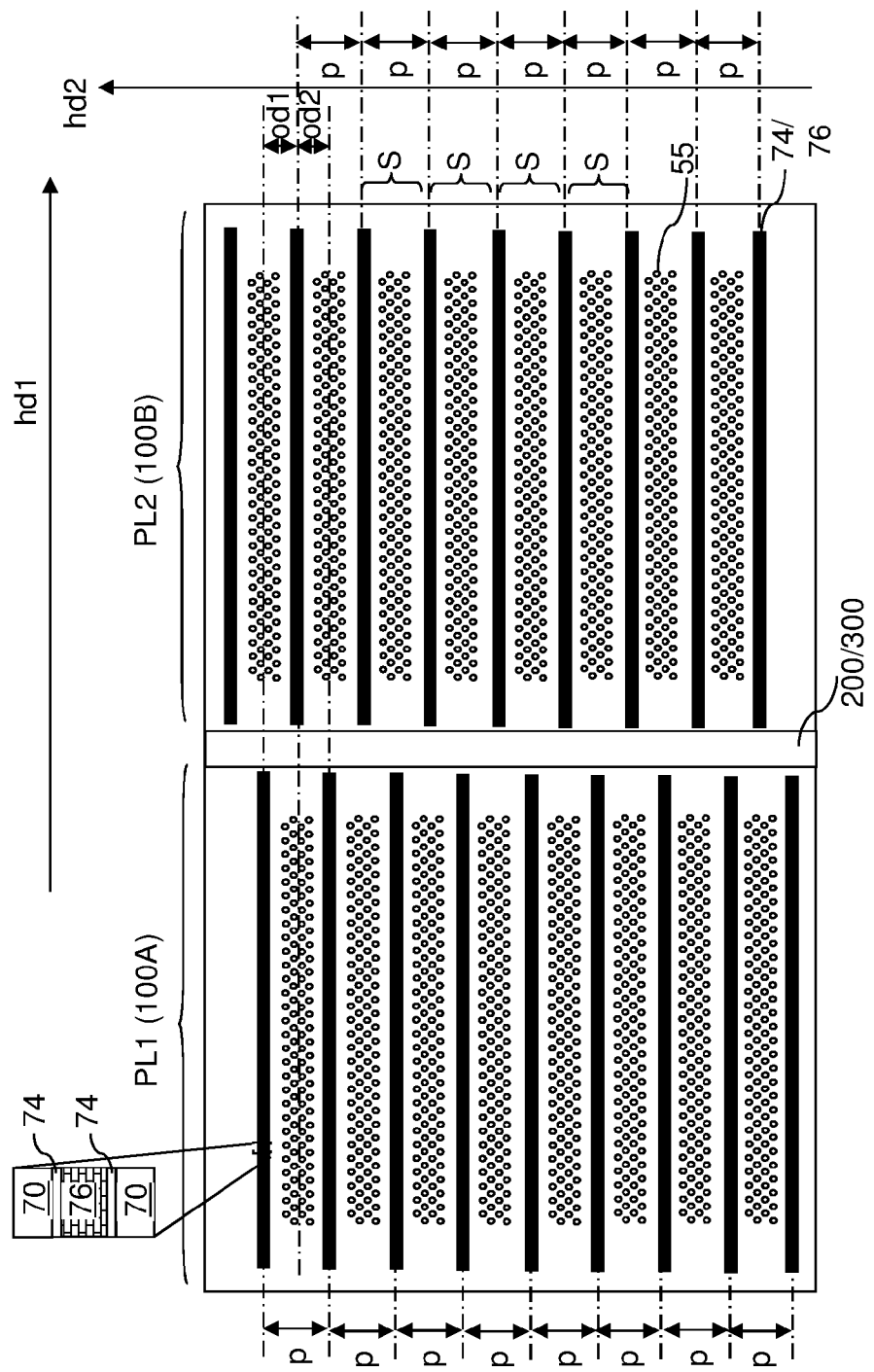
FIG. 16 is a second exemplary structure including a three-dimensional memory device in which backside contact via structures are laterally offset between neighboring planes according to an aspect of the present disclosure.
Figure 17:
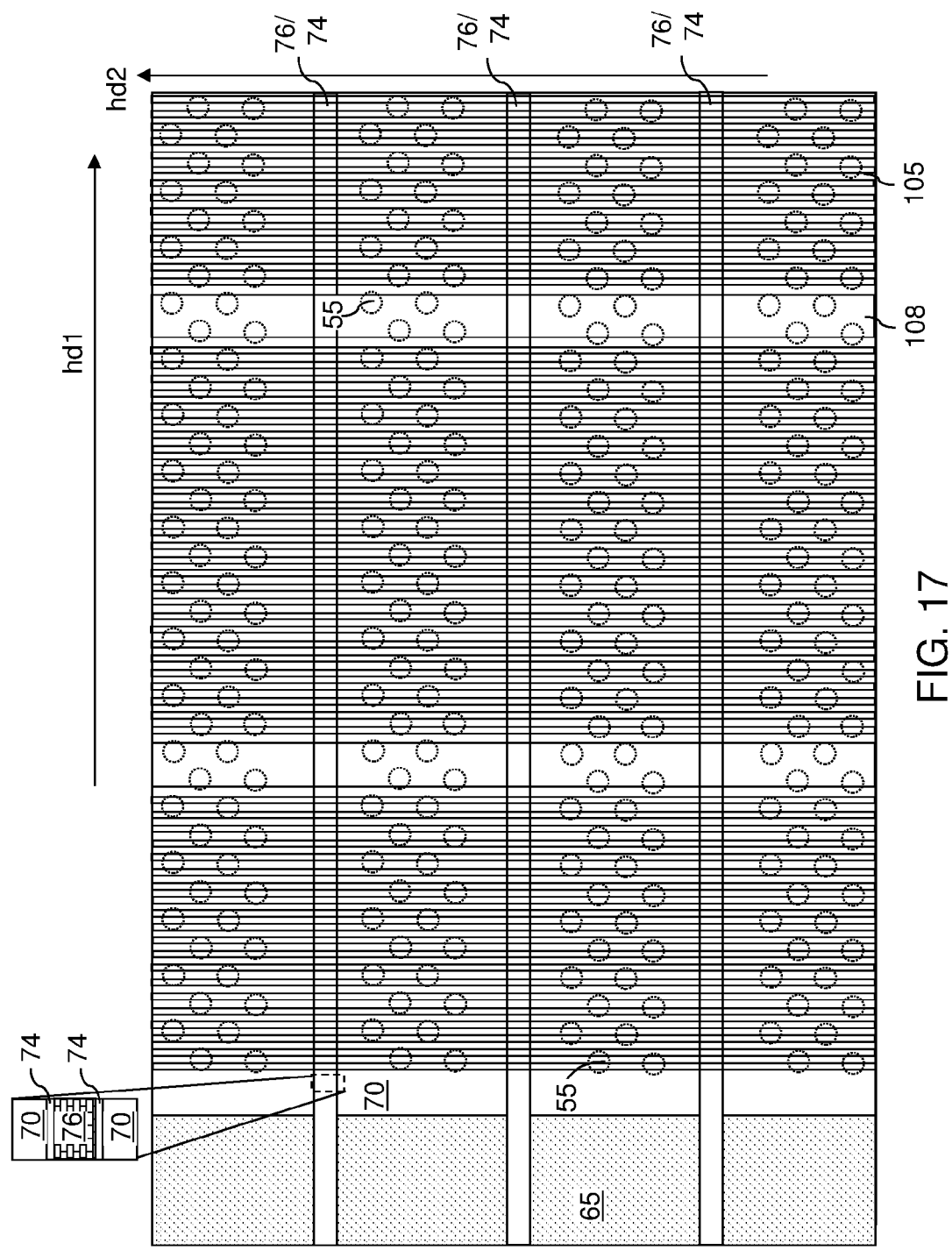
FIG. 17 is a see-through top-down view of a portion of a plane in the second exemplary structure of FIG. 16 according to an embodiment of the present disclosure.

FIGS. 15 and 16 illustrate plan views of exemplary three-dimensional memory devices including a plurality of planes, i.e., a first plane PL1 and a second plane PL2. As used herein, a "plane" refers to a unit of the three-dimensional memory device that includes multiple strings S of memory stack structures 55 arranged along a direction perpendicular to the lengthwise direction of the strings S of memory stack devices. FIG. 17 is a magnified view of a plane within the structure of FIG. 16.

In other words, each plane is a memory array region 100 (e.g., 100A) which is separated from one or more other planes (e.g., 100B) by least one of the peripheral device region 200 and the contact region 300 containing stepped terraces of electrically conductive layers. In one embodiment, each plane (100A, 100B) is a rectangular region surrounded on all four sides by the stepped terraces of the contact region 300.

The plurality of planes PL1 (e.g., 100A), PL2 (e.g., 100B), etc. can be laterally spaced apart along the first horizontal direction hd1, and can include at least a first plane PL1 and a second plane PL2. The first plane PL1 among the plurality of planes includes a first plurality of strings "S" that extend in the first horizontal direction hd1 and which are laterally spaced apart along the second horizontal direction hd2 by a first plurality of backside contact via structures 76. In one embodiment, the backside contact via structures 76 are spaced apart by a backside contact via structure pitch "p". In other words, the pitch "p" is a distance between a neighboring pair of backside contact via structures 76 among a set of backside contact via structures 76 in the second horizontal direction hd2. The second plane PL2 among the plurality of planes is located at a position laterally shifted from a position of the first plane PL1. The second plane may be laterally shifted from the first plane along the first horizontal plane hd1, along the horizontal direction hd2 and/or a combination of directions hd1 and hd2. For example, as shown in FIGS. 15 and 16, the second plane is shifted from the first plane in the first horizontal direction hd1. The second plane PL2 includes a second plurality of strings S that extend in the first horizontal direction hd1 and which are laterally spaced apart along the second horizontal direction hd2 by a second plurality of backside contact via structures 76 by the backside contact via structure pitch.

Preferably, the pitch between the second plurality of backside contact via structures 76 equals to "p" (i.e., equals to the pitch between the first plurality of backside contact via structures 76).

Each plurality of backside contact via structures 76 in the planes (PL1, PL2) can have the same configuration as any of the previously described backside contact via structures 76 of the present disclosure as schematically illustrated in FIG. 15. Alternatively, each plurality of backside contact via structures 76 in the planes (PL1, PL2) can linearly extend only along the first horizontal direction as schematically illustrated in FIG. 16 (e.g., without offsets or wiggles).

The sets of backside contact via structures 76 in a neighboring pair of planes (PL1, PL2) that are laterally offset from each other along the first horizontal direction hd1 can be laterally offset from each other by a finite distance. The finite distance is herein referred to as a lateral offset distance (such as od1), which can be in a range from 10% to 90% of the backside contact via structure pitch p. In one embodiment, the lateral offset distance can be in a range from 30% to 70% of the backside contact via structure pitch p. In another embodiment, the lateral offset distance can be in a range from 40% to 60% of the backside contact via structure pitch p. In yet another embodiment, the lateral offset distance can be substantially the same as 50% of the backside contact via structure pitch p. Each backside contact via structure 76 can consist of multiple portions that extend along the first horizontal direction and are laterally offset among one another as illustrated in FIG. 15, or can consist of a single linear, laterally extending portion as illustrated in FIGS. 16 and 17.

The smallest lateral offset distance that can be measured between the first plane PL1 and the second plane PL2 is herein referred to as a first lateral offset distance od1. The first lateral offset distance od1 is greater than 0, and does not exceed p/2. The first lateral offset distance od1 may, or may not, be equal to p/2. In case the first lateral offset distance od1 is not equal to p/2, the second smallest lateral offset distance that can be measured the first plane PL1 and the second plane PL2 is herein referred to as a second lateral offset distance od2. The second lateral offset distance is greater than p/2 and is less than p. The sum of the first lateral offset distance od1 and the second lateral offset distance od2 is equal to p.

The configurations of the present disclosure reduce die cracking by spreading along the substrate a stress caused by the metallic material(s) of the backside contact via structures 76 and word lines 46. Thus, the stress lines that extend from one end to another end of the substrate are replaced a more uniform stress distribution due to the offset structures in different planes. The reduction of local peak stress can be advantageously employed to improve the process margin for backside substrate thinning.

According to an aspect of the present disclosure, a three-dimensional memory device is provided, which includes an alternating stack of insulating layers 32 and electrically conductive layers 46 located over a substrate (9, 10); strings S of memory stack structures 55, wherein each of the memory stack structures 55 extends through the alternating stack (32, 46) and comprises a vertical stack of memory elements (as embodied as portions of the memory material layer 504 located at each level of the electrically conductive layers 46), a tunneling dielectric 506, and a vertical semiconductor channel 60; and backside contact via structures 76 vertically extending through the alternating stack (32, 46), extending generally along a first horizontal direction hd1, and laterally separating neighboring pairs of strings S of memory stack structures 55 along a second horizontal direction hd2 that is perpendicular to the first horizontal direction hd1. The three-dimensional memory device can comprise a plurality of planes (PL1, PL2) that are laterally spaced apart along the first horizontal direction hd1. A first plane PL1 among the plurality of planes includes a first plurality of strings S that are laterally spaced apart along the second horizontal direction hd2 by a first plurality of backside contact via structures 76 that are spaced apart by a backside contact via structure pitch p. A second plane PL2 among the plurality of planes is located at a position laterally shifted from a position of the first plane PL1 along the first horizontal plane hd1 and includes a second plurality of strings S that are laterally spaced apart along the second horizontal direction hd2 by a second plurality of backside contact via structures 76 by the backside contact via structure pitch p. The first plurality of backside contact via structures is laterally offset with respect the second plurality of backside contact via structures along the second horizontal direction by a finite distance, which can be in a greater than zero and the less than the backside contact via structure pitch p. In one embodiment, the finite offset distance between the first plurality of backside contact via structures and the second plurality of backside contact via structures can be one half of the backside contact via structure pitch p.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising a plurality of planes, wherein each of the plurality of planes comprises:

a respective alternating stack of insulating layers and electrically conductive layers located over a substrate;

strings of memory stack structures, wherein each of the memory stack structures extends through the respective alternating stack and comprises a vertical stack of memory elements, a tunneling dielectric, and a vertical semiconductor channel; and backside contact via structures vertically extending through the respective alternating stack, extending generally along a first horizontal direction, and laterally separating neighboring pairs of strings of memory stack structures along a second horizontal direction that is perpendicular to the first horizontal direction, wherein:

a first plane among the plurality of planes includes a first plurality of strings that are laterally spaced apart along the second horizontal direction by a first plurality of backside contact via structures;

a second plane among the plurality of planes is located at a position laterally shifted from a position of the first plane along the first horizontal direction and includes a second plurality of strings that are laterally spaced apart along the second horizontal direction by a second plurality of backside contact via structures; and the first plurality of backside contact via structures are laterally offset with respect the second plurality of backside contact via structures along the second horizontal direction, wherein:

each of the backside contact via structures includes multiple laterally extending portions that extend along the first horizontal direction and laterally offset along the second horizontal direction and adjoined by adjoining portions that laterally extend along a direction different from the first direction; and a first string among the strings of memory stack structures includes an outermost row of memory stack structures located along a straight line extending parallel to the first horizontal direction, wherein a region free of memory stack structures is provided between the outermost row of memory stack structures and a backside contact via structure among the backside contact via structures that is most proximal to the first string.

2. The three-dimensional memory device of claim 1, wherein:

the first plurality of backside contact via structures are spaced apart by a backside contact via structure pitch;

the second plurality of backside contact via structures are spaced apart by the backside contact via structure pitch; and a lateral offset distance between the first plurality of backside contact via structures and the second plurality of backside contact via structures is in a range from 10% to 90% of the backside contact via structure pitch.

3. The three-dimensional memory device of claim 1, wherein each backside contact via structure is laterally spaced from the strings of memory stack structures by a respective insulating spacer.

4. The three-dimensional memory device of claim 1, further comprising bit lines that are resistively connected to respective vertical semiconductor channels in the memory stack structures and laterally extending along the second horizontal direction.

5. The three-dimensional memory device of claim 1, further comprising doped semiconductor source regions located within the substrate and electrically connected to the backside contact via structures.

6. The three-dimensional memory device of claim 1, wherein:

each of the electrically conductive layers comprise word line strips that laterally extend generally along the first horizontal direction and laterally confined along the second horizontal direction by a pair of trenches including a pair of backside contact via structures; and each underlying electrically conductive layer within the alternating stack extends farther along the first horizontal direction than any overlying electrically conductive layer within the alternating stack.

7. The three-dimensional memory device of claim 1, wherein the backside contact via structure that is most proximal to the first string comprises:

a first backside contact via structure portion that is spaced from the outermost row of memory stack structures by a first distance along the second horizontal direction; and a second backside contact via structure portion that is spaced from the outermost row of memory stack structures by a second distance along the second horizontal direction.

8. The three-dimensional memory device of claim 7, wherein:

a first subset of at least two memory stack structures within the outermost row of memory stack structures is laterally spaced from the first backside contact via structure portion by the first distance; and a second subset of at least two other memory stack structures within the outermost row of memory stack structures is laterally spaced from the second backside contact via structure portion by the second distance.

9. The three-dimensional memory device of claim 7, wherein the first backside contact via structure portion and the second backside contact via structure portion are adjoined to each other by a third backside contact via structure portion that laterally extends along the second horizontal direction by a distance greater than a width of the first backside contact via structure portion.

10. The three-dimensional memory device of claim 7, wherein the first backside contact via structure portion and the second backside contact via structure portion are adjoined to each other by a third backside contact via structure portion that laterally extends along a horizontal direction between the first horizontal direction and the second horizontal direction by a distance greater than a width of the first backside contact via structure portion.

11. The three-dimensional memory device of claim 7, wherein the backside contact via structure that is most proximal to the first string includes at least three laterally extending portions that extend along the first horizontal direction and at least two adjoining portions that connect a neighboring pair of laterally extending portions such that the backside contact via structure that is most proximal to the first string generally extends at an oblique angle relative to the first horizontal direction.

12. The three-dimensional memory device of claim 7, wherein the backside contact via structure that is most proximal to the first string includes at least three laterally extending portions that extend along the first horizontal direction and at least two adjoining portions that connect a neighboring pair of laterally extending portions such that the backside contact via structure that is most proximal to the first string generally extends along the first horizontal direction with periodic lateral deviations along the second horizontal direction.

13. The three-dimensional memory device of claim 1, wherein:

the three-dimensional memory device comprises a vertical NAND device located over the substrate;

the electrically conductive layers comprise, or are electrically connected to, a respective word line of the NAND device;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

14. A method of forming a device structure, comprising:

forming an alternating stack of insulating layers and second layers over a substrate, wherein the second layers comprise sacrificial layers;

forming strings of memory stack structures, wherein each of the memory stack structures extends through the alternating stack and comprises a vertical stack of memory elements, a tunneling dielectric, and a vertical semiconductor channel;

forming backside contact trenches vertically extending through the alternating stack, extending generally along the first horizontal direction, and laterally separating neighboring pairs of strings of memory stack structures along a second horizontal direction that is perpendicular to the first horizontal direction;

replacing remaining portions of the second layers with electrically conductive layers; and forming backside contact via structures in the backside contact trenches, wherein:

a three-dimensional memory device comprising a plurality of planes is formed through formation of the backside contact via structures and the electrically conductive layers, each plane including a respective alternating stack of insulating layers and electrically conductive layers located over the substrate and a respective subset of the strings of memory stack structures;

a first plane among the plurality of planes includes a first plurality of strings that are laterally spaced apart along the second horizontal direction by a first plurality of backside contact via structures that are spaced apart by a backside contact via structure pitch;

a second plane among the plurality of planes is located at a position laterally shifted from a position of the first plane along the first horizontal plane and includes a second plurality of strings that are laterally spaced apart along the second horizontal direction by a second plurality of backside contact via structures by the backside contact via structure pitch;

the first plurality of backside contact via structures is laterally offset with respect the second plurality of backside contact via structures along the second horizontal direction;

each of the backside contact via structures includes multiple laterally extending portions that extend along the first horizontal direction and laterally offset along the second horizontal direction and adjoined by adjoining portions that laterally extend along a direction different from the first direction; and a first string among the strings of memory stack structures includes an outermost row of memory stack structures located along a straight line extending parallel to the first horizontal direction, wherein a region free of memory stack structures is provided between the outermost row of memory stack structures and a backside contact via structure among the backside contact via structures that is most proximal to the first string.

15. The method of claim 14, wherein a lateral offset distance between the first plurality of backside contact via structures and the second plurality of backside contact via structures is in a range from 10% to 90% of the backside contact via structure pitch.

16. The method of claim 14, further comprising:

forming source regions by implanting dopants into surface portions of the substrate through the backside contact trenches;

selectively removing the sacrificial layers through the backside contact trenches to form backside recesses;

forming electrically conductive layers in the backside recesses;

forming insulating spacers at peripheral portions of the backside contact trenches; and filling remaining volumes of the backside contact trenches after formation of the insulating spacers to form the backside contact via structures.

17. The method of claim 14, wherein each of the backside contact via structures includes multiple laterally extending portions that extend along a first horizontal direction and laterally offset along a second horizontal direction that is perpendicular to the first horizontal direction and adjoined by adjoining portions that laterally extend along a direction different from the first direction.

* * * * *